United States Patent
Matsuo

(10) Patent No.: US 10,500,857 B2
(45) Date of Patent: Dec. 10, 2019

(54) NOZZLE SUBSTRATE, INK-JET PRINT HEAD, AND METHOD FOR PRODUCING NOZZLE SUBSTRATE

(71) Applicant: ROHM Co., LTD., Kyoto (JP)

(72) Inventor: Nobufumi Matsuo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/800,904

(22) Filed: Nov. 1, 2017

(65) Prior Publication Data

US 2018/0117910 A1 May 3, 2018

(30) Foreign Application Priority Data

Nov. 2, 2016 (JP) .................. 2016-215418

(51) Int. Cl.
| | |
|---|---|
| *B41J 2/14* | (2006.01) |
| *B41J 2/16* | (2006.01) |
| *B81B 1/00* | (2006.01) |
| *B81C 1/00* | (2006.01) |
| *B81C 3/00* | (2006.01) |

(52) U.S. Cl.
CPC ......... *B41J 2/1433* (2013.01); *B41J 2/14233* (2013.01); *B41J 2/161* (2013.01); *B41J 2/162* (2013.01); *B41J 2/1623* (2013.01); *B41J 2/1626* (2013.01); *B41J 2/1628* (2013.01); *B41J 2/1631* (2013.01); *B41J 2/1632* (2013.01); *B41J 2/1635* (2013.01); *B41J 2/1642* (2013.01); *B81B 1/004* (2013.01); *B81C 1/00087* (2013.01); *B81C 3/001* (2013.01); *B41J 2002/14491* (2013.01); *B81B 2201/032* (2013.01); *B81B 2201/052* (2013.01); *B81C 2203/032* (2013.01)

(58) Field of Classification Search
CPC ...... B41J 2/1433; B41J 2/14233; B41J 2/162; B41J 2/1626
USPC .................. 347/20, 45, 47, 63, 65
See application file for complete search history.

(56) References Cited

U.S. PATENT DOCUMENTS 7,275,308 B2 * 10/2007 Kim .................. B41J 2/14137
                                                              29/611

FOREIGN PATENT DOCUMENTS

JP    2015-091668 A    5/2015

* cited by examiner

*Primary Examiner* — An H Do
(74) *Attorney, Agent, or Firm* — Chip Law Group

(57) ABSTRACT

There is provided a nozzle substrate including a nozzle hole penetrating in a thickness direction. The nozzle substrate includes a main substrate including a first surface and a second surface, an oxidation film formed on the second surface of the main substrate, and a water repellent film formed on a surface at an opposite side to the main substrate side of the oxidation film. The nozzle hole includes a first through hole penetrating the main substrate in a thickness direction, a second through hole penetrating the oxidation film and being connected to the first through hole, and a third through hole penetrating the water repellent film and being connected to the second through hole. An inner circumference surface of the second through hole and an inner circumference surface of the third through hole are approximately flush.

3 Claims, 35 Drawing Sheets

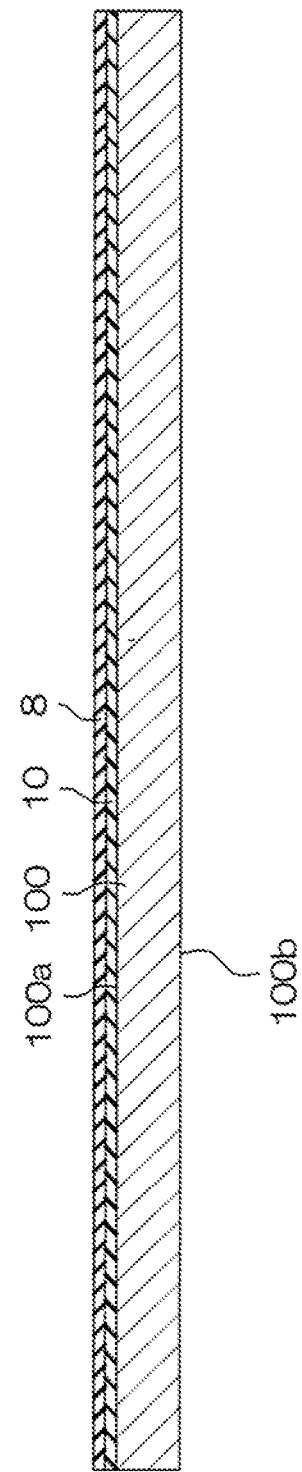

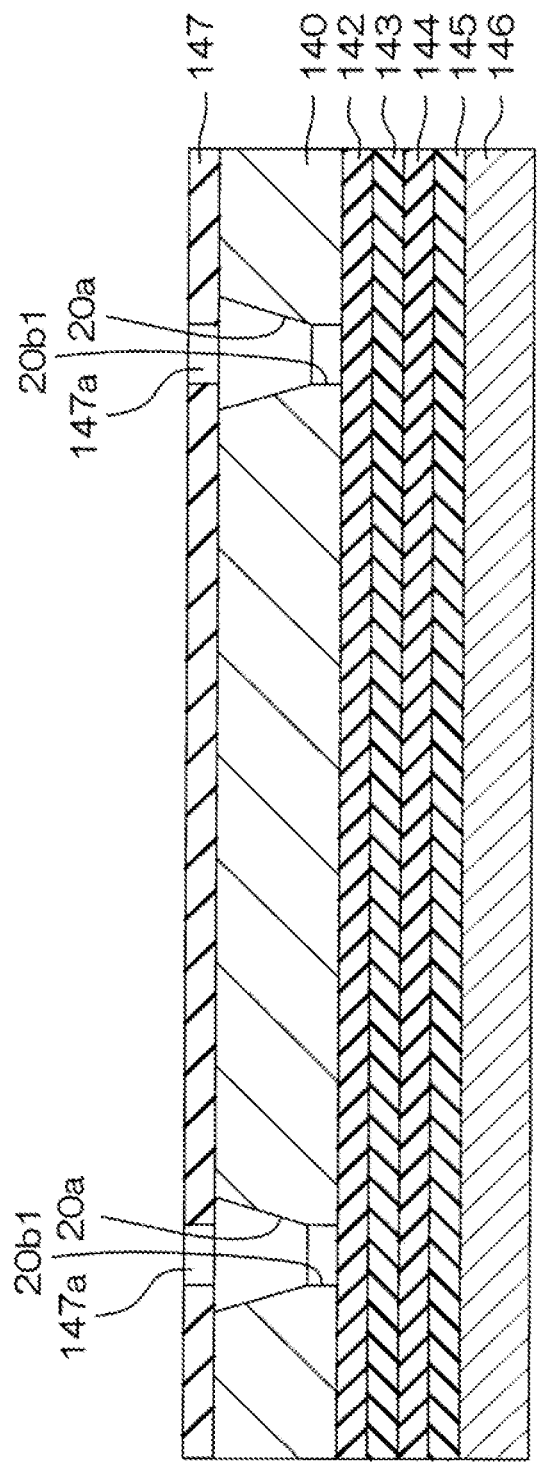

NOZZLE SUBSTRATE, INK-JET PRINT HEAD, AND METHOD FOR PRODUCING NOZZLE SUBSTRATE

CROSS REFERENCE TO RELATED APPLICATIONS

This U.S. Application claims priority benefit of Japanese Patent Application No. JP 2016-215418 filed in the Japan Patent Office on Nov. 2, 2016. Each of the above-referenced applications is hereby incorporated herein by reference in its entirety.

BACKGROUND

The present disclosure relates to a nozzle substrate, an ink-jet print head, and a method for producing a nozzle substrate.

Japanese Patent Laid-Open No. 2015-91668 (hereinafter referred to as Patent Document 1) discloses an ink-jet print head. The ink-jet print head of Patent Document 1 includes an actuator substrate (substrate) including a pressure chamber (pressure occurrence chamber) as the ink flow path, a movable film (elasticity film) formed on the actuator substrate, and a piezoelectric element disposed on the movable film. The ink-jet print head of Patent Document 1 further includes a nozzle substrate (nozzle plate) being joined to the lower surface of the actuator substrate and including a nozzle opening (nozzle hole) connected to the pressure chamber, and a protection substrate being joined to the upper surface of the actuator substrate and covering the piezoelectric element. The piezoelectric element includes a first electrode film (bottom portion electrode) formed on the movable film, a second electrode film (top portion electrode) disposed on the first electrode film, and a piezoelectric layer (piezoelectric film) held between them.

SUMMARY

The inventors tried producing a nozzle substrate, which includes a silicon substrate including a first surface and a second surface, a silicon oxide film formed on the second surface of the silicon substrate, and a water repellent film formed on the surface of the silicon oxide film, and further includes a nozzle hole penetrating in the thickness direction. The water repellent film includes an organic film, such as fluorine-based polymer and the like. The nozzle hole was formed as described below. That is, a resist mask including an opening corresponding to the nozzle hole was formed on the first surface side of the silicon substrate, and the silicon substrate was subjected to etching with this resist mask used as the mask, so as to form a first through hole with a circular shape of a transverse section which penetrates the silicon substrate. Then, while the resist mask was used as a mask, the silicon oxide film and the water repellent film were continuously subjected to etching, so as to form a second through hole with a circular shape of a transverse section on the silicon oxide film which was connected to the first through hole, and subsequently a third through hole with a circular shape of a transverse section connected to the second through hole was formed on the water repellent film. Then, ashing processing was performed so as to remove the resist mask.

Regarding the case that the nozzle hole was formed as described above, it was found that, during ashing processing, the circumference wall (inner circumference surface) of the third through hole formed on the water repellent film was subjected to etching by the ashing gas so as to make the third through hole be enlarged.

There is a need for the present disclosure to provide a nozzle substrate, an ink-jet print head, and a method for producing a nozzle substrate in which the shape and size of the transverse section of the third through hole formed on the water repellent film is approximately equal to the shape and size of the transverse section of the second through hole formed on the oxidation film.

The nozzle substrate according to the present disclosure is a nozzle substrate including a nozzle hole penetrating in a thickness direction. The nozzle substrate includes a main substrate including a first surface and a second surface, an oxidation film formed on the second surface of the main substrate, and a water repellent film formed on a surface at an opposite side to the main substrate side of the oxidation film. The nozzle hole includes a first through hole penetrating the main substrate in a thickness direction, a second through hole penetrating the oxidation film and being connected to the first through hole, and a third through hole penetrating the water repellent film and being connected to the second through hole. An inner circumference surface of the second through hole and an inner circumference surface of the third through hole are approximately flush.

In this configuration, the shape and size of the transverse section of the third through hole formed on the water repellent film is approximately equal to the shape and size of the transverse section of the second through hole formed on the oxidation film.

In one embodiment of the present disclosure, transverse sections of the second through hole and the third through hole are circular and percentage of a ratio (D2−D1)/D1 of a value, in which a diameter D1 of the second through hole is subtracted from a diameter D2 of the third through hole, relative to the diameter D1 of the second through hole is equal to or less than 11.5%.

In one embodiment of the present disclosure, the first through hole includes a recessed part formed on the first surface of the main substrate and a hole penetrating a bottom wall of the recessed part of the main substrate.

In one embodiment of the present disclosure, the recessed part has a truncated cone shape whose transverse section is gradually reduced from the first surface side of the main substrate to the oxidation film side.

In one embodiment of the present disclosure, the main substrate is a silicon substrate, the oxidation film is a silicon oxide film, and the water repellent film is made of fluorine-based polymer.

The ink-jet print head according to the present disclosure includes an actuator substrate including an ink flow path with a pressure chamber, a movable film form layer including a movable film disposed on the pressure chamber and defining a top surface portion of the pressure chamber, a piezoelectric element formed on the movable film, and a nozzle substrate joined by an adhesive agent to an opposite side surface to a surface of the movable film side of the actuator substrate, defining a bottom surface portion of the pressure chamber, and including a nozzle hole connected to the pressure chamber. The nozzle substrate is the nozzle substrate of the present disclosure, the first surface of the main substrate is joined to the opposite side surface to the surface of the movable film side of the actuator substrate.

One embodiment of the present disclosure further includes a protection substrate joined by an adhesive agent to the actuator substrate so as to cover the piezoelectric element. The protection substrate includes a housing recessed portion opened toward the actuator substrate side and accommodating the piezoelectric element, and an ink supply path formed outside of one end of the housing recessed portion in a plan view and connected to one end portion of the ink flow path.

The method for producing a nozzle substrate according to the present disclosure includes preparing a stack film including a main substrate having a first surface and a second surface, an oxidation film formed on the second surface of the main substrate, and a water repellent film formed on an opposite side surface to the main substrate side of the oxidation film, forming a resist mask on the first surface side of the stack film including an opening corresponding to a nozzle hole, and using this resist mask as a mask to perform etching on the main substrate so as to form a first through hole penetrating in a thickness direction on the main substrate, performing ashing processing to remove the resist mask, and using the main substrate as a hard mask to continuously perform etching on the oxidation film and the water repellent film so as to form a second through hole on the oxidation film which penetrates the oxidation film and is connected to the first through hole, and then forming a third through hole on the water repellent film that penetrates the water repellent film and is connected to the second through hole.

By this producing method, a nozzle substrate is produced in which the shape and size of the transverse section of the third through hole formed on the water repellent film is approximately equal to the shape and size of the transverse section of the second through hole formed on the oxidation film.

In one embodiment of the present disclosure, the preparing the stack film includes forming oxidation films on the first surface and the second surface of the main substrate, forming a water repellent film on the oxidation film at the second surface side of the main substrate, and polishing the main substrate from the oxidation film side on the first surface so as to make the main substrate be subjected to film thinning until a predetermined thickness.

In one embodiment of the present disclosure, the first through hole includes a recessed part formed on the first surface of the main substrate and a hole penetrating a bottom wall of the recessed part of the main substrate.

In one embodiment of the present disclosure, the recessed part has a truncated cone shape whose transverse section is gradually reduced from the first surface side of the main substrate to the oxidation film side.

In one embodiment of the present disclosure, transverse sections of the second through hole and the third through hole are circular.

In one embodiment of the present disclosure, the main substrate is a silicon substrate, the oxidation film is a silicon oxide film, and the water repellent film is made of fluorine-based polymer.

BRIEF DESCRIPTION OF THE DRAWINGS

FIG. 15A is a transverse sectional view illustrating an example of a production step of the ink-jet print head;

FIG. 16E is a transverse sectional view illustrating a next step of FIG. 16D;

DETAILED DESCRIPTION OF THE PREFERRED EMBODIMENT

In the following description, an embodiment of the present disclosure will be described in detail by referring to the accompanying drawings.

Figure 1:
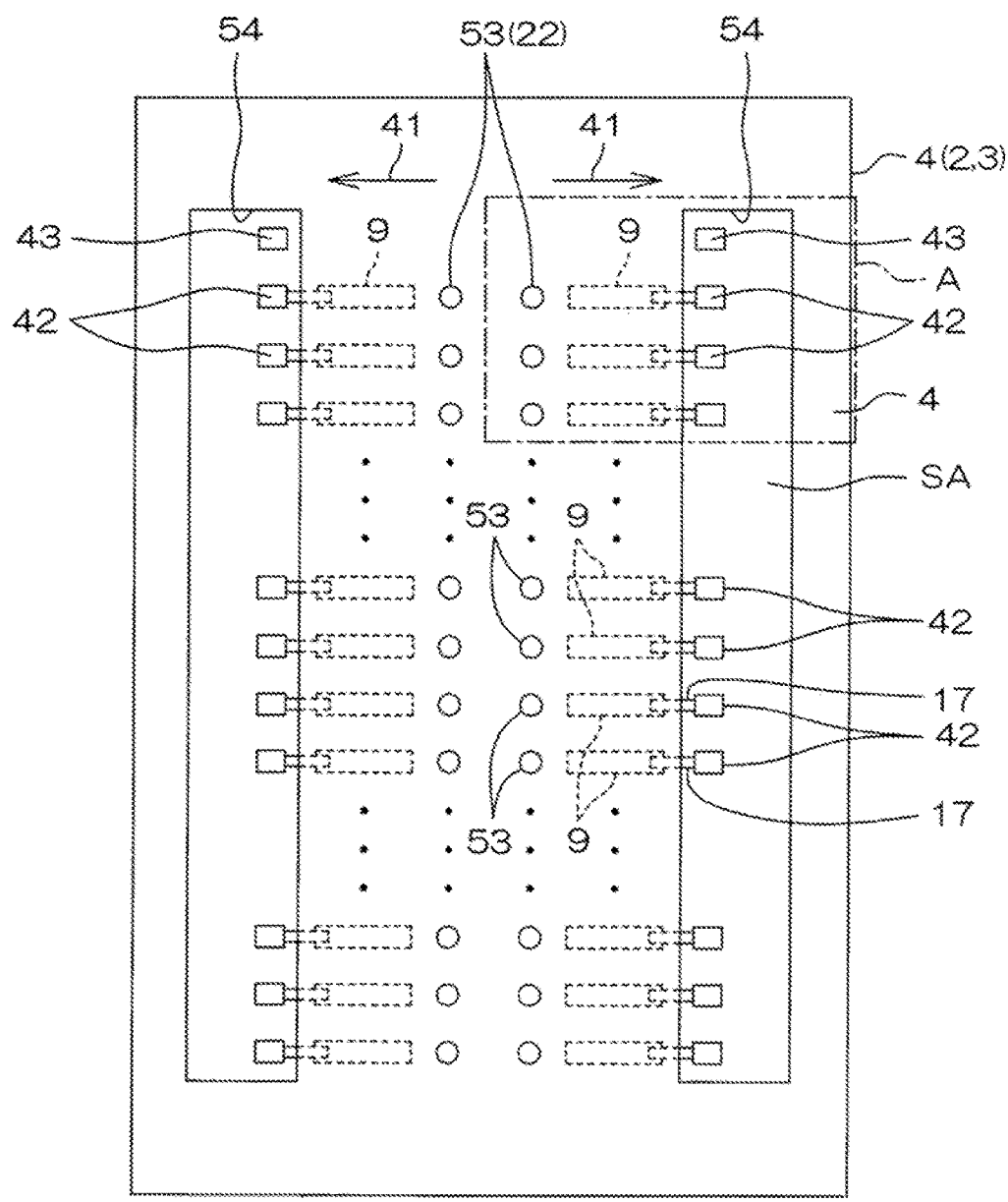
FIG. 1 is a schematic plan view for illustrating a configuration of an ink-jet print head according to an embodiment of the present disclosure.
Figure 2:
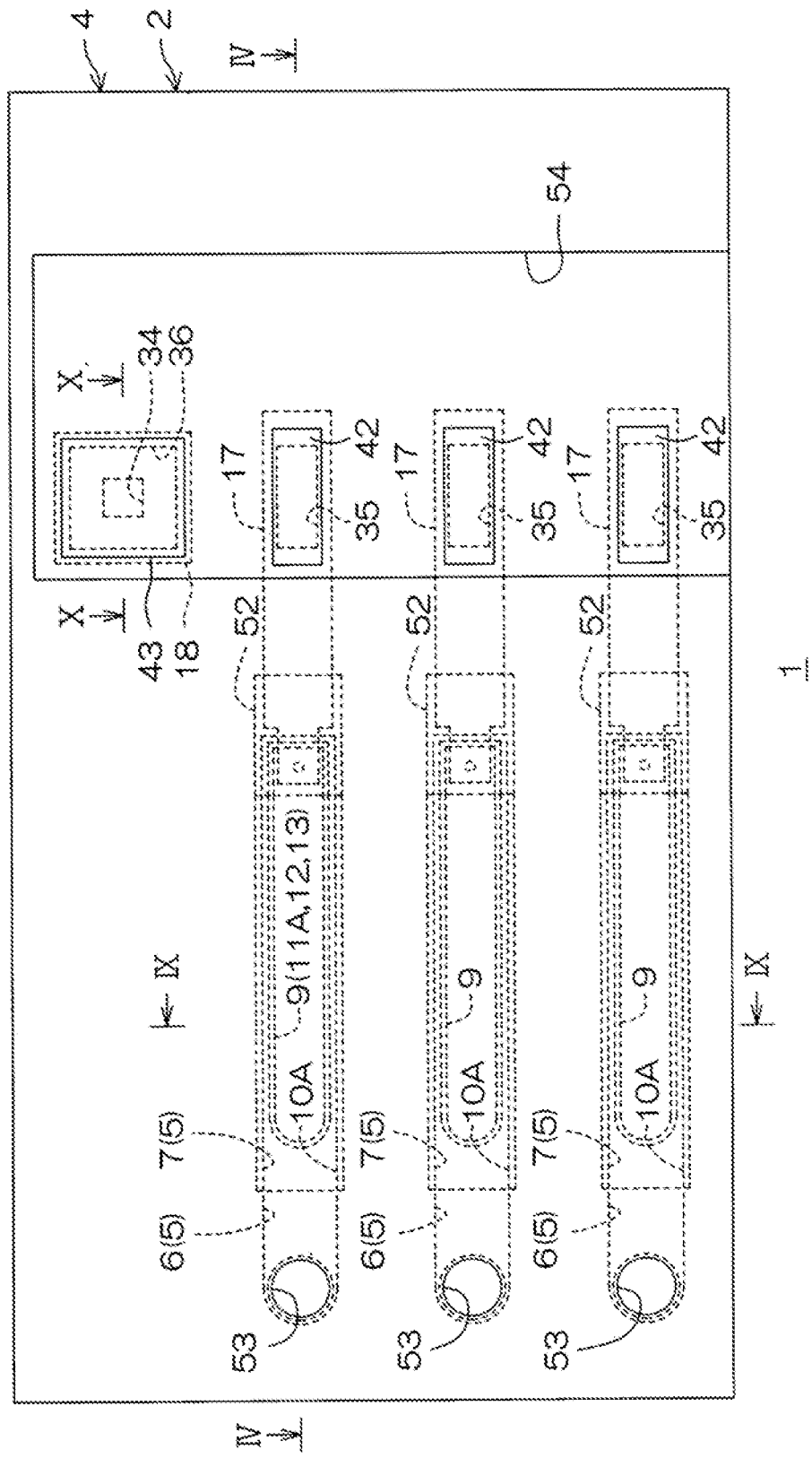
FIG. 2 is a schematic partially-enlarged plan view for enlarging and illustrating an A portion of FIG. 1 and is a plan view of including a protection substrate.
Figure 3:
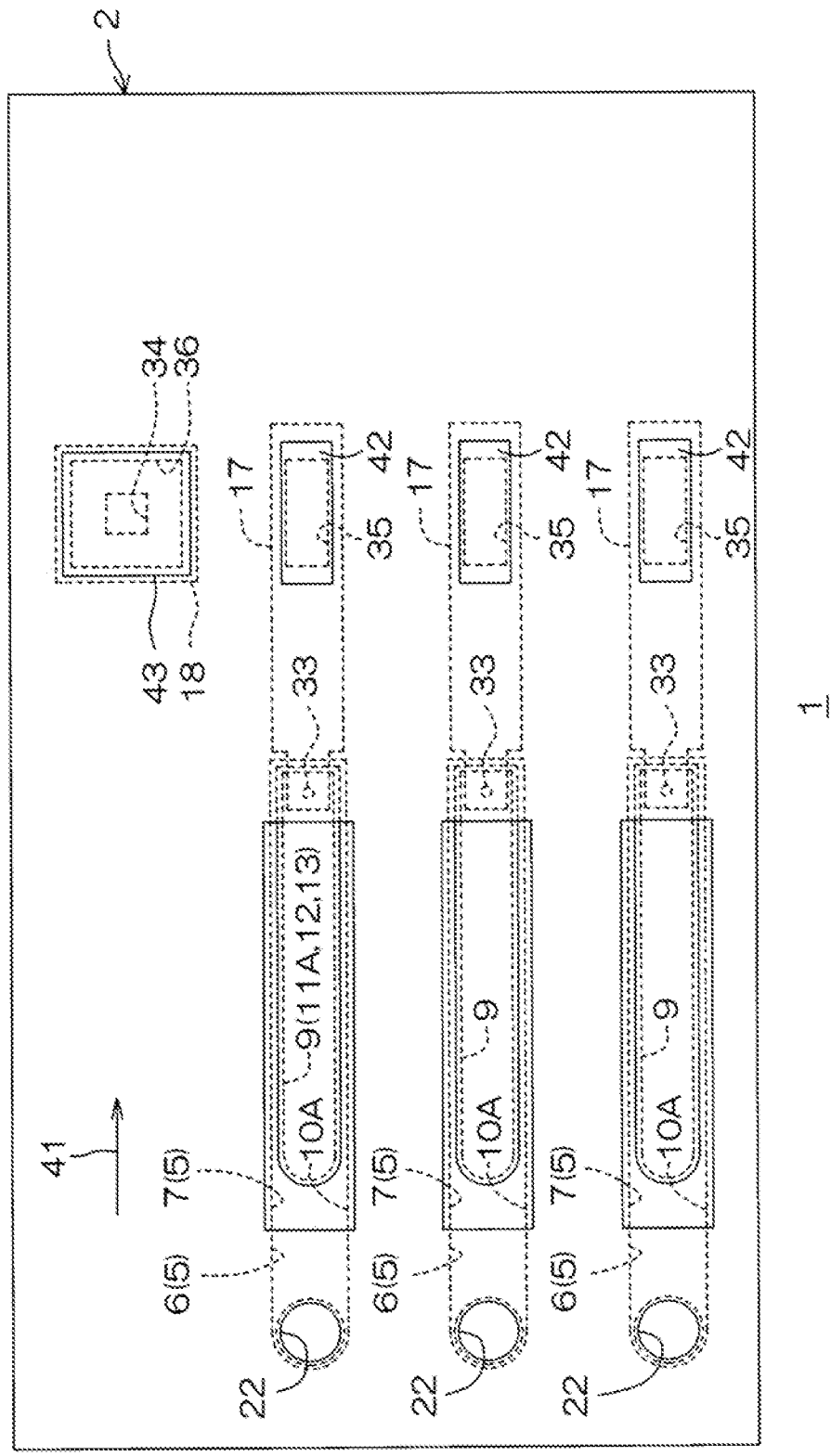
FIG. 3 is a schematic partially-enlarged plan view for enlarging and illustrating the A portion of FIG. 1 and is a plan view in which the protection substrate is omitted.
Figure 4:
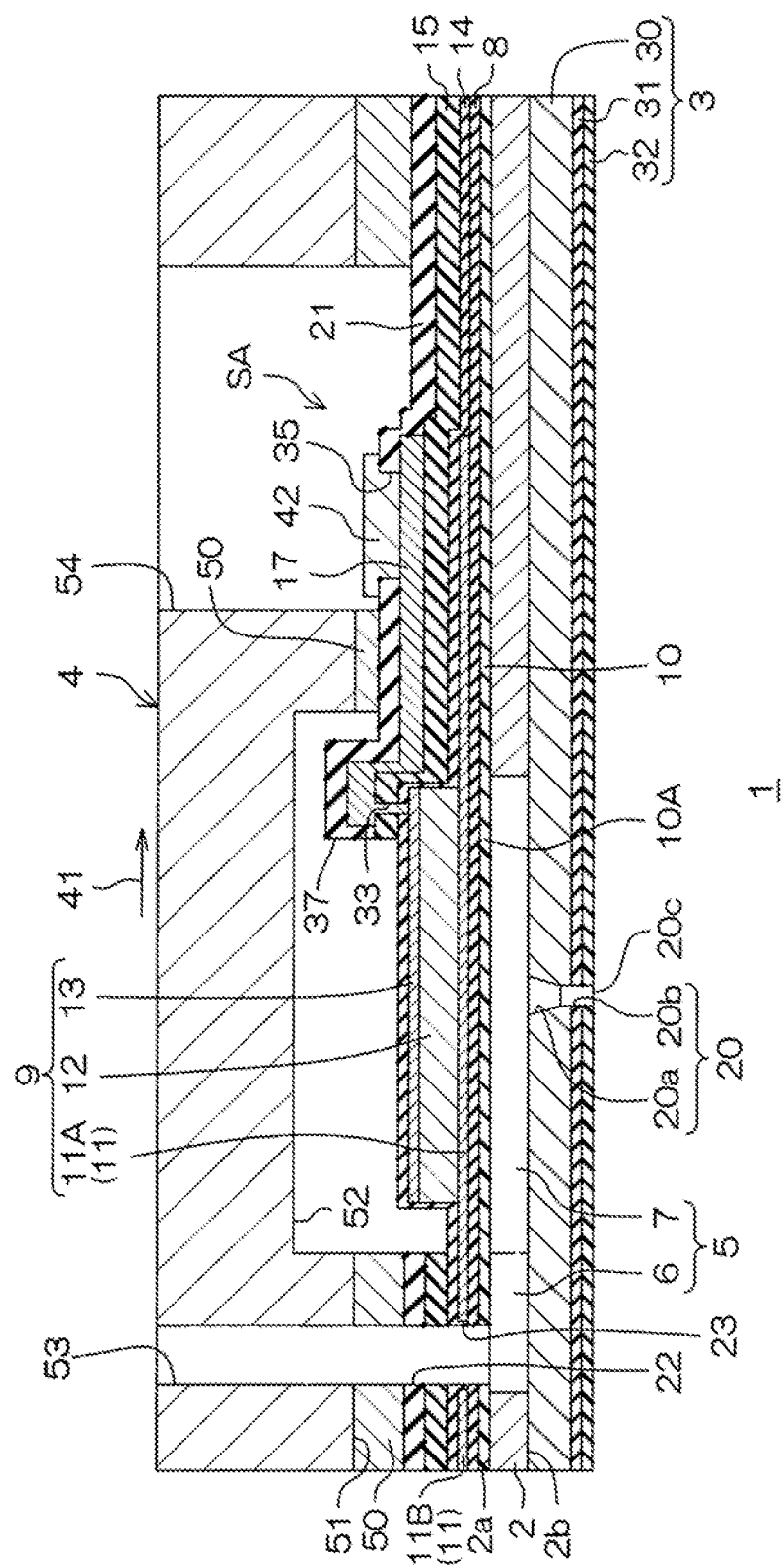
FIG. 4 is a schematic transverse-sectional view cut along IV-IV line of FIG. 2.
Figure 5:
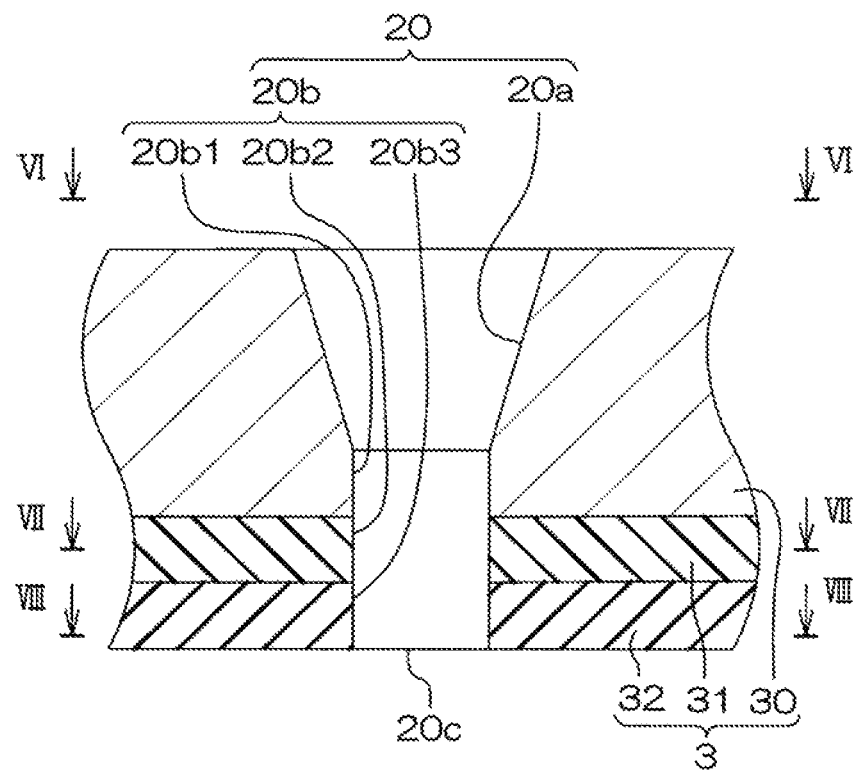
FIG. 5 is an enlarged transverse-sectional view for enlarging and illustrating a nozzle hole of FIG. 4.
Figure 6:
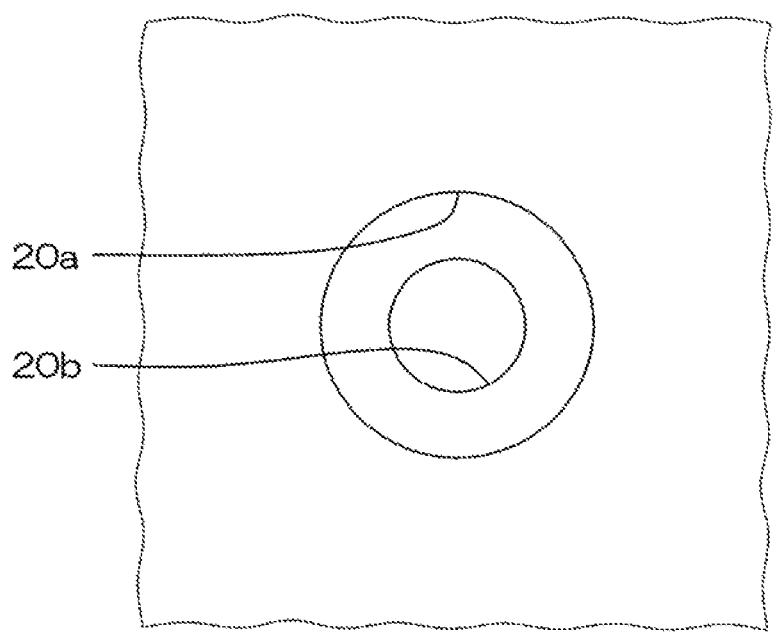
FIG. 6 is a plan view which is viewed from arrow VI-VI of FIG. 5.
Figure 7:
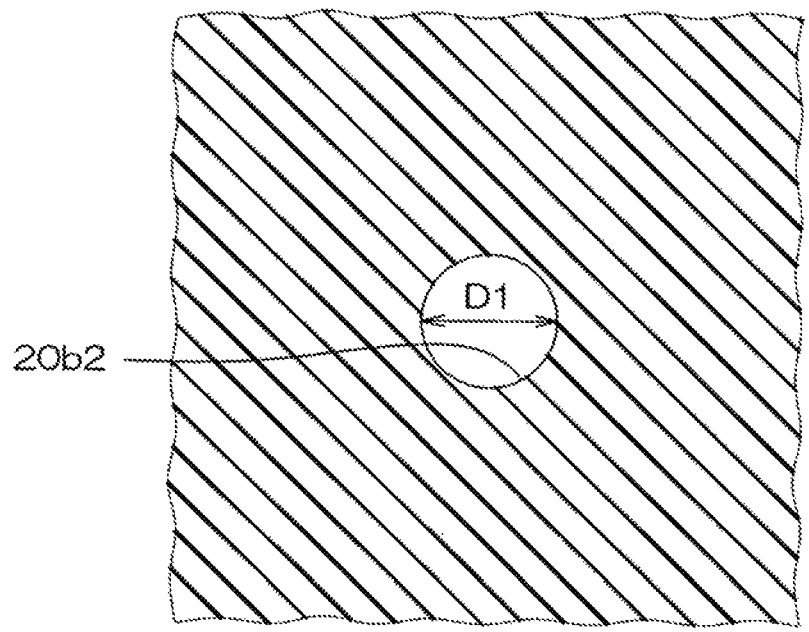
FIG. 7 is a transverse sectional view cut along VII-VII line of FIG. 5.
Figure 8:
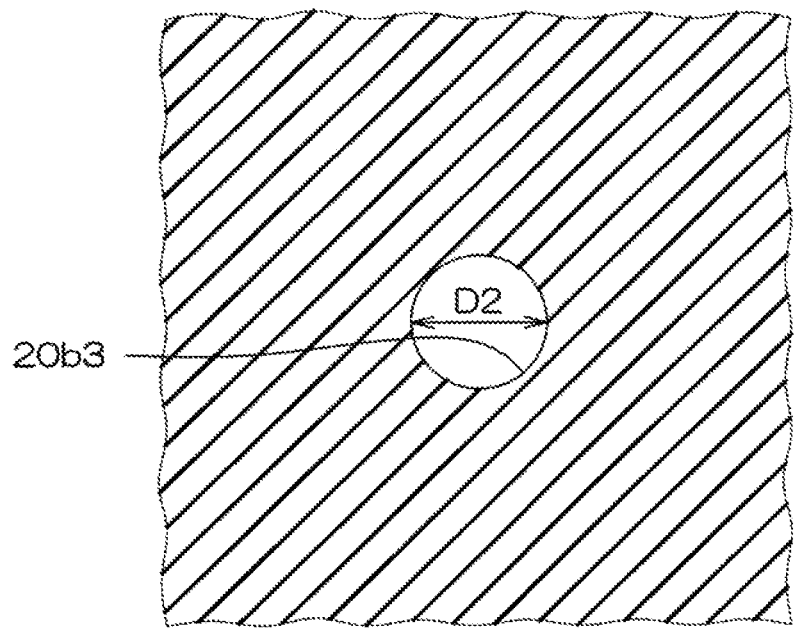
FIG. 8 is a transverse sectional view cut along VIII-VIII line of FIG. 5.
Figure 9:
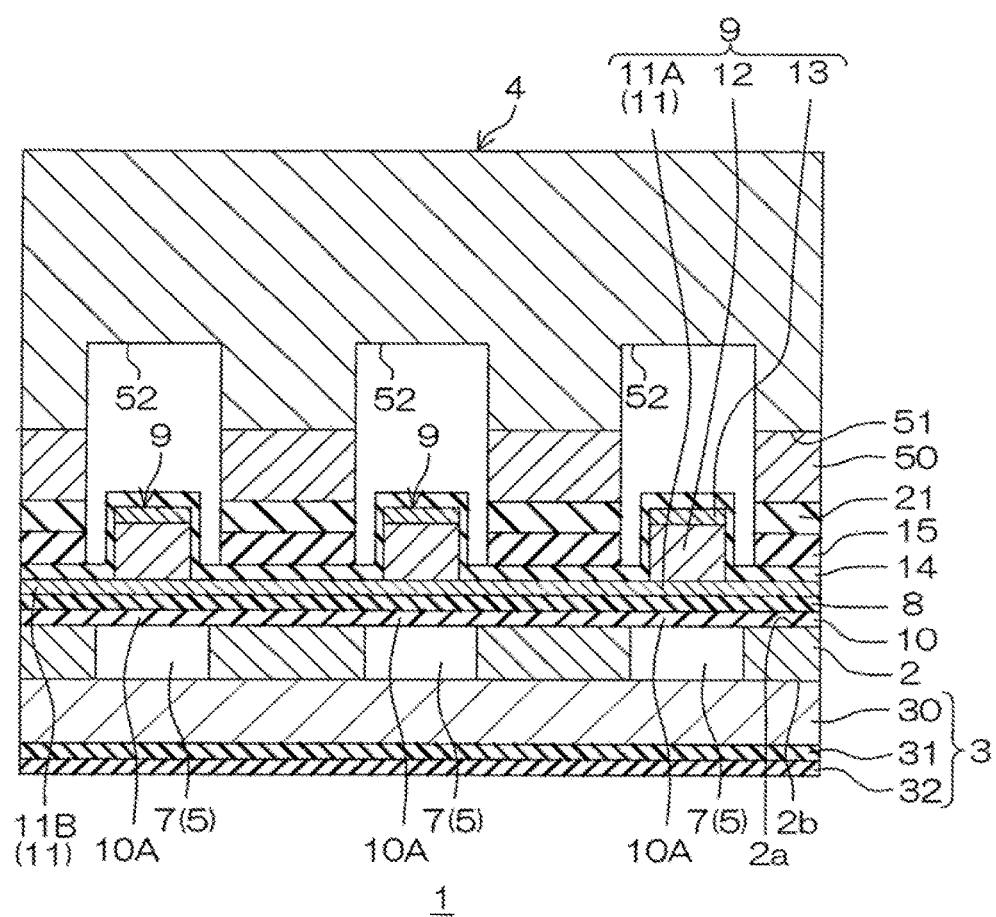
FIG. 9 is a schematic transverse-sectional view cut along IX-IX line of FIG. 2.
Figure 10:
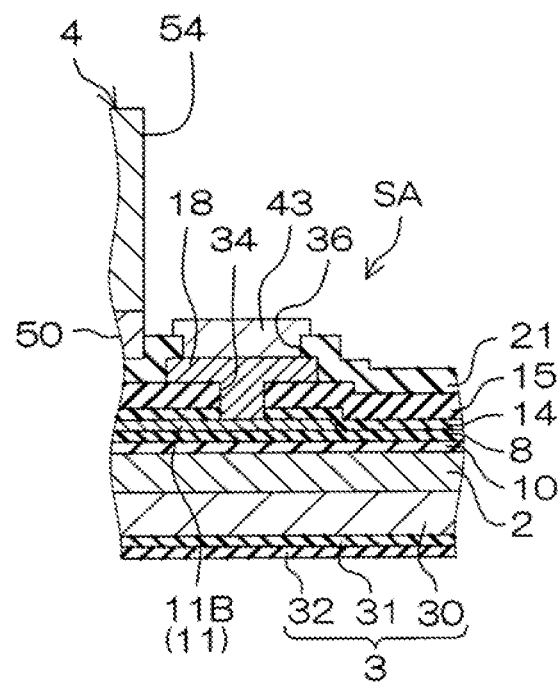
FIG. 10 is a schematic transverse-sectional view cut along X-X line of FIG. 2.

FIG. 1 is a schematic plan view for illustrating a configuration of an ink-jet print head according to an embodiment of the present disclosure. FIG. 2 is a schematic partially-enlarged plan view for enlarging and illustrating an A portion of FIG. 1 and is a plan view of including a protection substrate. FIG. 3 is a schematic partially-enlarged plan view for enlarging and illustrating the A portion of FIG. 1 and is a plan view in which the protection substrate is omitted. FIG. 4 is a schematic transverse-sectional view cut along IV-IV line of FIG. 2. FIG. 5 is an enlarged transverse-sectional view for enlarging and illustrating a nozzle hole of FIG. 4. FIG. 6 is a plan view which is viewed from arrow VI-VI of FIG. 5. FIG. 7 is a transverse sectional view cut along VII-VII line of FIG. 5. FIG. 8 is a transverse sectional view cut along VIII-VIII line of FIG. 5. FIG. 9 is a schematic transverse-sectional view cut along IX-IX line of FIG. 2. FIG. 10 is a schematic transverse-sectional view cut along X-X line of FIG. 2.

By referring to FIG. 4, the configuration of an ink-jet print head 1 will be schematically described.

The ink-jet print head 1 includes an actuator substrate assembly SA including an actuator substrate 2 and a piezoelectric element 9, a nozzle substrate 3, and a protection substrate 4. Hereinafter, the actuator substrate assembly SA will be referred to as a substrate assembly SA.

On a surface 2a of the actuator substrate 2, a movable film form layer 10 is stacked. On the actuator substrate 2, an ink flow path (ink accumulation) 5 is formed. The ink flow path 5 in the present embodiment is formed to penetrate the actuator substrate 2. The ink flow path 5 is formed to extend thin and long along an ink flowing direction 41 depicted by the arrow in FIG. 4. The ink flow path 5 is consisted of an ink inflowing portion 6 of the upstream side end (left end in FIG. 4) of the ink flowing direction 41 and a pressure chamber 7 connected to an ink inflowing portion 6. In FIG. 4, the boundary between the ink inflowing portion 6 and the pressure chamber 7 is depicted by a two-dot chain line.

The nozzle substrate 3 is, for example, consisted of a silicon (Si) substrate (main substrate) 30, a silicon oxide (SiO2) film 31 formed on the opposite side surface (second surface) to the pressure chamber 7 of the silicon substrate 30, and a water repellent film 32 formed on the opposite side surface to the silicon substrate 30 of the silicon oxide film 31. The water repellent film 32 in the present embodiment is consisted of an organic film, such as fluorine-based polymer and the like. In the present embodiment, the thickness of the silicon substrate 30 is approximately 40 μm, the film thickness of the silicon oxide film 31 is approximately 0.1 μm, and the film thickness of the water repellent film 32 is approximately 0.1 μm.

The nozzle substrate 3 is stacked on a rear surface 2b of the actuator substrate 2 in a state that the surface (first surface) at the silicon substrate 30 side faces to the rear surface 2b of the actuator substrate 2. With the actuator substrate 2 and the movable film form layer 10, the nozzle substrate 3 defines the ink flow path 5. More specifically, the nozzle substrate 3 defines the bottom surface portion of the ink flow path 5.

By referring to FIG. 4 to FIG. 8, a nozzle hole 20 is formed on the nozzle substrate 3. The nozzle hole 20 is consisted of a recessed part 20a fronting the pressure chamber 7, and an ink ejecting path 20b formed on the bottom surface of the recessed part 20a. The recessed part 20a is formed on the surface at the actuator substrate 2 side of the silicon substrate 30. The ink ejecting path 20b penetrates the bottom wall of the recessed part 20a and includes an ink ejecting port 20c at the opposite side to the pressure chamber 7.

As illustrated in FIG. 5, the ink ejecting path 20b is consisted of a first ink ejecting path 20b1 penetrating the recessed part 20a of the silicon substrate 30, a second ink ejecting path 20b2 penetrating the silicon oxide film 31 and connected to the first ink ejecting path 20b1, and a third ink ejecting path 20b3 penetrating the water repellent film 32 and connected to the second ink ejecting path 20b2. The recessed part 20a and the first ink ejecting path 20b1 configures a first through hole penetrating the silicon substrate 30. The second ink ejecting path 20b2 configures a second through hole penetrating the silicon oxide film 31. The third ink ejecting path 20b3 configures a third through hole penetrating the water repellent film 32. When a volume change in the pressure chamber 7 occurs, the ink accumulated in the pressure chamber 7 passes ink ejecting path 20b and is ejected from the ink ejecting port 20c.

In the present embodiment, the recessed part 20a is formed to have a truncated cone shape whose transverse section is gradually reduced from the surface of the silicon substrate 30 to the silicon oxide film 31 side. The ink ejecting path 20b has a solid cylindrical shape. In other words, the ink ejecting path 20b is consisted of a straight hole whose transverse section is circular. A diameter of the second ink ejecting path (second through hole) 20b2 is referred to as D1 (see FIG. 7), and a diameter of the third ink ejecting path (third through hole) 20b3 is referred to as D2 (see FIG. 8). In the present embodiment, D1 is approximately 17.5 μm, and D2 is approximately 17.9 to 19.5 μm. A percentage of a ratio $\{(D2-D1)/D1\}$ of a value, in which the diameter D1 is subtracted from the diameter D2, relative to the diameter D1 is equal to or less than 11.5%.

The top wall portion of the pressure chamber 7 in the movable film form layer 10 configures a movable film 10A. The movable film 10A (movable film form layer 10) is, for example, consisted of a silicon oxide (SiO2) film formed on the actuator substrate 2. The movable film 10A (movable film form layer 10) may be consisted of, for example, a stack film including a silicon (Si) film formed on the actuator substrate 2, a silicon oxide (SiO2) film formed on the silicon film, and a silicon nitride (SiN) film formed on the silicon oxide film. In this specification, the movable film 10A means a top wall portion of the movable film form layer 10 that defines the top surface portion of the pressure chamber 7. Thus, portions of the movable film form layer 10 other than the top wall portion of the pressure chamber 7 do not configure the movable film 10A.

The thickness of the movable film 10A is, for example, 0.4 to 2 μm. In the case that the movable film 10A is consisted of the silicon oxide film, the thickness of the silicon oxide film may be approximately 1.2 μm. In the case that the movable film 10A is consisted of a stack film including a silicon film, a silicon oxide film, and a silicon nitride film, each thickness of the silicon film, the silicon oxide film, and the silicon nitride film may be approximately 0.4 μm.

The pressure chamber 7 is defined by the movable film 10A, the actuator substrate 2, and the nozzle substrate 3, and is formed in the present embodiment to have an approximately rectangular parallelepiped shape. The length of the pressure chamber 7 may be, for example, approximately 800 μm, and the width may be approximately 55 μm. The ink inflowing portion 6 communicates with one end portion in the longitudinal direction of the pressure chamber 7.

A metal barrier film 8 is formed on the surface of the movable film form layer 10. The metal barrier film 8 is, for example, made of Al2O3 (alumina). The thickness of the metal barrier film 8 is approximately 50 to 100 nm. A piezoelectric element 9 is disposed on the surface of the metal barrier film 8 at the above position of the movable film 10A. The piezoelectric element 9 includes a bottom portion electrode 11 formed on the metal barrier film 8, a piezoelectric film 12 formed on the bottom portion electrode 11, and a top portion electrode 13 formed on the piezoelectric film 12. In other words, the piezoelectric element 9 is configured by the piezoelectric film 12 held upward and downward with the top portion electrode 13 and the bottom portion electrode 11.

The top portion electrode 13 may be a single film made of platinum (Pt), or, for example, may include a stack structure in which conductive oxidation film (for example, IrO2 (iridium oxide) film) and metal film (for example, Ir (iridium) film) are stacked. The thickness of the top portion electrode 13 may be, for example, approximately 0.2 μm.

As for the piezoelectric film 12, it is possible to apply PZT (PbZrxTi1−xO3: lead zirconate titanate) film formed by sol-gel method or spattering method, for example. The piezoelectric film 12 as described above is consisted of a sintered body of the metal oxide crystal. The piezoelectric film 12 is formed to have a shape similar to the top portion electrode 13 in a plan view. The thickness of the piezoelectric film 12 is approximately 1 μm. It is preferable to make the whole thickness of the movable film 10A be approximately equal to the thickness of the piezoelectric film 12, or be approximately ⅔ of the thickness of the piezoelectric film 12. Above-described metal barrier film 8 mainly suppresses metal elements (Pb, Zr, and Ti in the case that the piezoelectric film 12 is PZT) from breaking out from the piezoelectric film 12 so as to keep the piezoelectric property of the piezoelectric film 12 in a satisfactory manner, and suppresses the metal from being diffused on the movable film 10A at the film formation time of the piezoelectric film 12. The metal barrier film 8 further has a function of suppressing the characteristic degradation caused by hydrogen reduction on the piezoelectric film 12.

The bottom portion electrode 11 has a two-layer structure in which, for example, Ti (titanium) film and Pt (platinum) film are stacked in order from the metal barrier film 8 side. Outside of this, the bottom portion electrode 11 may be formed to be consisted of a single film, such as Au (aurum) film, Cr (chromium) layer, Ni (nickel) layer, and the like. The bottom portion electrode 11 includes a main electrode portion 11A coming into contact with the lower surface of the piezoelectric film 12, and an extending portion 11B extending to a region outside the piezoelectric film 12. The thickness of the bottom portion electrode 11 may be, for example, approximately 0.2 μm.

A hydrogen barrier film 14 is formed on the piezoelectric element 9, on the extending portion 11B of the bottom portion electrode 11, and on the metal barrier film 8. The hydrogen barrier film 14 is, for example, made of Al2O3 (alumina). The thickness of the hydrogen barrier film 14 is approximately 50 to 100 nm. The hydrogen barrier film 14 is disposed to suppress the characteristic degradation caused by hydrogen reduction on the piezoelectric film 12.

An insulation film 15 is stacked on the hydrogen barrier film 14. The insulation film 15 is, for example, made of SiO2, low hydrogen SiN, and the like. The thickness of the insulation film 15 is approximately 500 nm. On the insulation film 15, a top portion wiring 17 and a bottom portion wiring 18 (see FIG. 2 and FIG. 10) are formed. These wirings may be made of metal material including Al (aluminum). The thickness of these wirings is, for example, approximately 1000 nm (1 μm).

One end portion of the top portion wiring 17 is disposed above the one end portion of the top portion electrode 13 (downstream side end in the ink flowing direction 41). Between the top portion wiring 17 and the top portion electrode 13, a contact hole 33 is formed that penetrates the hydrogen barrier film 14 and the insulation film 15 in sequence. One end portion of the top portion wiring 17 gets into the contact hole 33, and is coupled to the top portion electrode 13 in the contact hole 33. The top portion wiring 17 extends from a part above the top portion electrode 13, across the outer edge of the pressure chamber 7, to the outside of the pressure chamber 7. The bottom portion wiring 18 will be described later.

On the insulation film 15, a passivation film 21 is formed that covers the top portion wiring 17, the bottom portion wiring 18, and the insulation film 15. The passivation film 21 is, for example, consisted of SiN (silicon nitride). The thickness of the passivation film 21 is, for example, approximately 800 nm.

On the passivation film 21, a pad opening 35 is formed that make the top portion wiring 17 be partially exposed. The pad opening 35 is formed on the outside region of the pressure chamber 7. For example, it is formed on the distal end portion of the top portion wiring 17 (opposite side end of the contact portion to the top portion electrode 13). On the passivation film 21, a pad for the top portion electrode 42 is formed that covers the pad opening 35. The pad for the top portion electrode 42 gets into the pad opening 35, and is coupled to the top portion wiring 17 in the pad opening 35. At the bottom portion wiring 18, a pad for the bottom portion electrode 43 (see FIG. 2 and FIG. 10) is disposed. The pad for the bottom portion electrode 43 will be described later.

At a position corresponding to an end at the ink inflowing portion 6 side on the ink flow path 5, a through hole for the ink supply 22 is formed that penetrates the passivation film 21, the insulation film 15, the hydrogen barrier film 14, the bottom portion electrode 11, the metal barrier film 8, and the movable film form layer 10. On the bottom portion electrode 11, a great through hole 23 is formed, which includes a through hole for the ink supply 22 and is larger than the through hole for the ink supply 22. A hydrogen barrier film 14 gets into gaps of the through hole 23 and the through hole for the ink supply 22 of the bottom portion electrode 11. The through hole for the ink supply 22 communicates with the ink inflowing portion 6.

The protection substrate 4 is, for example, consisted of a silicon substrate. The protection substrate 4 is disposed on the substrate assembly SA to cover the piezoelectric element 9. The protection substrate 4 is joined to the substrate assembly SA through an adhesive agent 50. The protection substrate 4 includes a housing recessed portion 52 on a facing surface 51 that faces to the substrate assembly SA.

The piezoelectric element 9 is accommodated in the housing recessed portion 52. Further, on the protection substrate 4, an ink supply path 53 connected to the through hole for the ink supply 22 and an opening 54 for making the pads 42 and 43 be exposed are formed. The ink supply path 53 and the opening 54 penetrate the protection substrate 4. On the protection substrate 4, an ink tank (not illustrated) storing ink is disposed.

The piezoelectric element 9 is formed at a position facing to the pressure chamber 7 between the movable film 10A and the metal barrier film 8. That is, the piezoelectric element 9 is formed to come into contact with an opposite side surface to the pressure chamber 7 of the metal barrier film 8. Ink is supplied from the ink tank to the pressure chamber 7, through the ink supply path 53, the through hole for the ink supply 22, and the ink inflowing portion 6, so that the ink is filled in the pressure chamber 7. The movable film 10A defines the top surface portion of the pressure chamber 7 and fronts the pressure chamber 7. The movable film 10A is supported by portions around the pressure chamber 7 on the actuator substrate 2, and has flexibility to deform in a direction facing to the pressure chamber 7 (in other words, thickness direction of the movable film 10A).

The bottom portion wiring 18 (see FIG. 2 and FIG. 10) and the top portion wiring 17 are coupled to a drive circuit (not illustrated). Specifically, the pad for the top portion electrode 42 and the drive circuit are coupled through a coupling metal member (not illustrated). The pad for the bottom portion electrode 43 (see FIG. 2 and FIG. 10) and the drive circuit are coupled through a coupling metal member (not illustrated). When drive voltage is applied from the drive circuit to the piezoelectric element 9, the piezoelectric film 12 is deformed by inverse piezoelectric effect. This ensures that, the piezoelectric element 9 and the movable film 10A are deformed to cause volume change in the pressure chamber 7, so as to make the ink in the pressure chamber 7 be pressed. The pressed ink is ejected as microdroplets from the ink ejecting port 20c through the ink ejecting path 20b.

By referring to FIG. 1 to FIG. 10, the configuration of the ink-jet print head 1 will be described in more detail below. in the following description, the left side of FIG. 1 is referred to as "left," the right side of FIG. 1 is referred to as "right," the bottom side of FIG. 1 is referred to as "front," and the top side of FIG. 1 is referred to as "rear."

As illustrated in FIG. 1, the plan view shape of the ink-jet print head 1 is rectangular and longer in the front and rear direction. In the present embodiment, the plane shapes and sizes of the actuator substrate 2, the protection substrate 4, and the nozzle substrate 3 are approximately similar to the plane shape and size of the ink-jet print head 1.

On the actuator substrate 2, rows each including a plurality of piezoelectric elements 9 and arranged in a stripe manner with intervals in the front and rear direction in the plan view (hereinafter, referred to as "piezoelectric element array") are disposed with intervals in the lateral direction so that a plurality of rows are disposed. In the present embodiment, two rows of the piezoelectric element arrays are disposed for the sake of description.

As illustrated in FIG. 2 and FIG. 3, an ink flow path 5 (pressure chamber 7) is formed on the actuator substrate 2, every piezoelectric element 9. Thus, on the actuator substrate 2, two rows of the ink flow path array (pressure chamber array) consisted of a plurality of ink flow paths 5 (pressure chambers 7) arranged in a stripe manner with intervals in the front and rear direction in the plan view are disposed with intervals in the lateral direction.

In FIG. 1, a pattern of the ink flow path array corresponding to the left-side piezoelectric element array and a pattern of the ink flow path array corresponding to the right side piezoelectric element array are left-right symmetry with respect to the line passing the center between these rows. Thus, regarding the ink flow path 5 contained in the left-side ink flow path array, the ink inflowing portion 6 is positioned at the right side with respect to the pressure chamber 7, but regarding the ink flow path 5 contained in the right-side ink flow path array, the ink inflowing portion 6 is positioned at the left side with respect to the pressure chamber 7. Thus, the ink flowing direction 41 of the left-side ink flow path array is inverse to the ink flowing direction 41 of the right-side ink flow path array.

The through hole for the ink supply 22 is disposed by a plurality of ink flow path 5 in each ink flow path array. The through hole for the ink supply 22 is disposed on the ink inflowing portion 6. Thus, the through hole for the ink supply 22 with respect to the ink flow path 5 contained in the left-side ink flow path array is disposed at the right end of the ink flow path 5, and the through hole for the ink supply 22 with respect to the ink flow path 5 contained in the right-side ink flow path array is disposed at the left end of the ink flow path 5.

In each ink flow path array, a plurality of ink flow paths 5 are formed and spaced away by equal intervals of small intervals (for example, approximately 30 to 350 µm) in their own width directions. Each ink flow path 5 extends thin and long along the ink flowing direction 41. The ink flow path 5 is consisted of the ink inflowing portion 6 connected to the through hole for the ink supply 22 and the pressure chamber 7 connected to the ink inflowing portion 6. In the plan view, the pressure chamber 7 has a rectangular shape extending thin and long along the ink flowing direction 41. That is, the top surface portion of the pressure chamber 7 includes two side edges along the ink flowing direction 41 and two end edges along a direction orthogonal to the ink flowing direction 41. In the plan view, the width of the ink inflowing portion 6 is approximately the same as the width of the pressure chamber 7. The inner surface of the end portion at the opposite side to the pressure chamber 7 on the ink inflowing portion 6 is formed to be semicircular in the plan view. In the plan view, the through hole for the ink supply 22 is circular (see FIG. 3, in particular).

In the plan view, the piezoelectric element 9 has a rectangular shape long in the longitudinal direction of the pressure chamber 7 (movable film 10A). The length of the piezoelectric element 9 in the longitudinal direction is shorter than the length of the pressure chamber 7 (movable film 10A) in the longitudinal direction. As illustrated in FIG. 3, the both end edges along the short side direction of the piezoelectric element 9 are individually disposed at the inner sides of the corresponding both end edges of the movable film 10A spaced away by predetermined intervals. In addition, the width of the piezoelectric element 9 in the short side direction is narrower than the width of the movable film 10A in the short side direction. The both sides edges along the longitudinal direction of the piezoelectric element 9 are disposed at the inner sides of the corresponding both sides edges of the movable film 10A spaced away by predetermined intervals.

The bottom portion electrode 11 is formed on almost all regions of the surface of the movable film form layer 10, other than the circumference edge portion of the surface of the movable film form layer 10. The bottom portion electrode 11 is a common electrode shared for the plurality of piezoelectric elements 9. The bottom portion electrode 11 includes a main electrode portion 11A, which configures the piezoelectric element 9 and has a rectangular shape in the plan view, and includes an extending portion 11B, which is drawn out from the main electrode portion 11A in a direction along the surface of the movable film form layer 10 and extends toward the outside of the circumference edge of the top surface portion of the pressure chamber 7.

The length of the main electrode portion 11A in the longitudinal direction is shorter than the length of the movable film 10A in the longitudinal direction. The both end edges of the main electrode portion 11A are individually disposed at the inner sides of the corresponding both end edges of the movable film 10A spaced away by predetermined intervals. In addition, the width of the main electrode portion 11A in the short side direction is narrower than the width of the movable film 10A in the short side direction. The both sides edges of the main electrode portion 11A are disposed at the inner sides of the corresponding both sides edges of the movable film 10A spaced away by predetermined intervals. The extending portion 11B is a region where the main electrode portion 11A is removed from the whole region of the bottom portion electrode 11.

In the plan view, the top portion electrode 13 is formed to have a rectangular shape in the same pattern as the main electrode portion 11A of the bottom portion electrode 11. In other words, the length of the top portion electrode 13 in the longitudinal direction is shorter than the length of the movable film 10A in the longitudinal direction. The both end edges of the top portion electrode 13 are individually disposed at the inner sides of the corresponding both end edges of the movable film 10A spaced away by predetermined intervals. In addition, the width of the top portion electrode 13 in the short side direction is narrower than the width of the movable film 10A in the short side direction. The both sides edges of the top portion electrode 13 are disposed at the inner sides of the corresponding both sides edges of the movable film 10A spaced away by predetermined intervals.

In the plan view, the piezoelectric film 12 is formed to have a rectangular shape in the same pattern as the top portion electrode 13. In other words, the length of the piezoelectric film 12 in the longitudinal direction is shorter than the length of the movable film 10A in the longitudinal direction. The both end edges of the piezoelectric film 12 are individually disposed at the inner sides of the corresponding both end edges of the movable film 10A spaced away by predetermined intervals. In addition, the width of the piezoelectric film 12 in the short side direction is narrower than the width of the movable film 10A in the short side direction. The both sides edges of the piezoelectric film 12 are disposed at the inner side of the corresponding both sides edges of the movable film 10A spaced away by predetermined intervals. The lower surface of the piezoelectric film 12 comes into contact with the upper surface of the main electrode portion 11A of the bottom portion electrode 11, and the upper surface of the piezoelectric film 12 comes into contact with the lower surface of the top portion electrode 13.

The top portion wiring 17 extends from the upper surface of one end portion (downstream-side end of the ink flowing direction 41) of the piezoelectric element 9 along the end surface of the piezoelectric element 9 continuing to the upper surface, and further extends along the surface of the extending portion 11B of the bottom portion electrode 11 in a direction along the ink flowing direction 41. The distal end portion of the top portion wiring 17 is disposed in the opening 54 of the protection substrate 4.

On the passivation film 21, a pad opening for the top portion electrode 35 is formed that makes the center portion of the distal end portion surface of the top portion wiring 17 be exposed. On the passivation film 21, a pad for the top portion electrode 42 is disposed to cover the pad opening for the top portion electrode 35. The pad for the top portion electrode 42 is coupled to the top portion wiring 17 in the pad opening for the top portion electrode 35. As illustrated in FIG. 1, the plurality of pads for the top portion electrode 42 corresponding to the plurality of piezoelectric elements 9 in the left-side piezoelectric element array are disposed, in plan view, in a single-line manner in the front and rear direction at the left side of the left-side piezoelectric element array. In addition, the plurality of pads for the top portion electrode 42 corresponding to the plurality of piezoelectric elements 9 in the right-side piezoelectric element array are disposed, in plan view, in a single-line manner in the front and rear direction at the right side of the right-side piezoelectric element array.

By referring to FIG. 1, FIG. 2, FIG. 3, and FIG. 10, the bottom portion wirings 18 in the plan view are individually disposed at the rear position of the left-side pad array for the top portion electrode and at the rear position of the right-side pad array for the top portion electrode. In the plan view, the bottom portion wiring 18 has a square shape. Downward the bottom portion wiring 18, the extending portion 11B of the bottom portion electrode 11 exists. Between the bottom portion wiring 18 and the extending portion 11B of the bottom portion electrode 11, a contact hole 34 is formed that penetrates the hydrogen barrier film 14 and the insulation film 15 in sequence. The bottom portion wiring 18 gets into the contact hole 34 and is coupled to the extending portion 11B of the bottom portion electrode 11 in the contact hole 34.

On the passivation film 21, a pad opening 36 is formed that makes the center portion of the surface of the bottom portion wiring 18 be exposed. On the passivation film 21, a pad for the bottom portion electrode 43 is formed to cover the pad opening 36. The pad for the bottom portion electrode 43 gets into the pad opening 36, and is coupled to the bottom portion wiring 18 in the pad opening 36.

On the protection substrate 4, as illustrated in FIG. 1, FIG. 2, and FIG. 4, a plurality of ink supply paths 53 connected to the plurality of through holes for the ink supply 22 with respect to the left-side ink flow path array (hereinafter, occasionally referred to as "first ink supply path 53") and a plurality of ink supply paths 53 connected to the plurality of through holes for the ink supply 22 with respect to the right-side ink flow path array (hereinafter, occasionally referred to as "second ink supply path 53") are formed. In the plan view, the first ink supply paths 53 are disposed at positions shifted to the left side with respect to the width center of the protection substrate 4 and are arranged in a single-line manner with intervals in the front and rear direction. In the plan view, the second ink supply paths 53 are disposed at positions shifted to the right side with respect to the width center of the protection substrate 4, and are arranged in a single-line manner with intervals in the front and rear direction. In the plan view, the ink supply path 53 is circular in the same pattern as the through hole for the ink supply 22 at the actuator substrate 2 side. In the plan view, the ink supply path 53 matches the through hole for the ink supply 22.

In addition, on the protection substrate 4, an opening 54 is formed that makes all the pads for the top portion electrode 42 corresponding to the left-side piezoelectric element array and the left-side pads for the bottom portion electrode 43 be exposed. In addition, on the protection substrate 4, an opening 54 is formed that makes all the pads for the top portion electrode 42 corresponding to the right-side piezoelectric element array and the right-side pad for the bottom portion electrode 43 be exposed. In the plan view, these openings 54 have rectangular shapes long in the front and rear direction.

Figure 13:
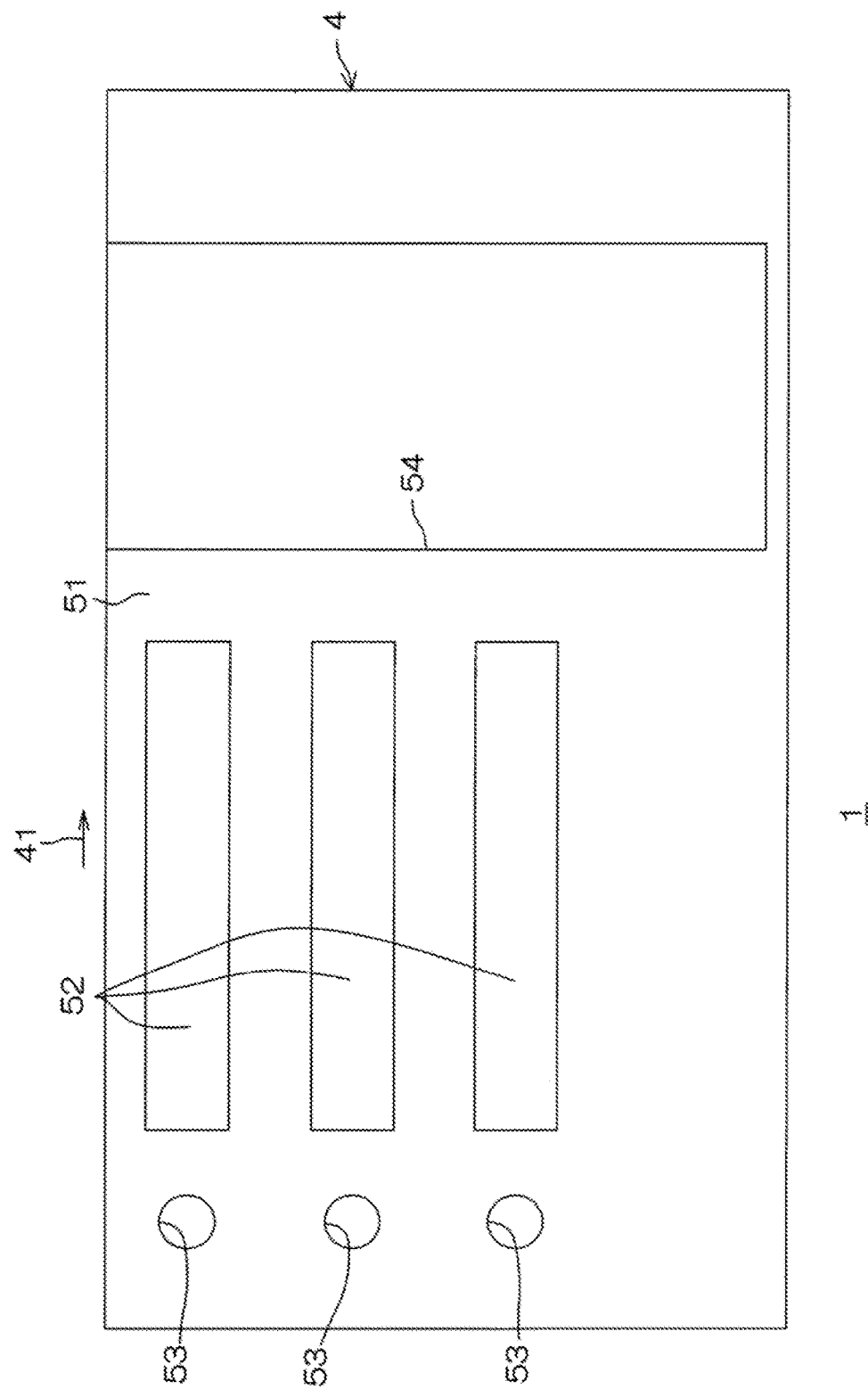
FIG. 13 is a bottom view of a region of the protection substrate depicted in FIG. 2.

FIG. 13 is a bottom view of a region of the protection substrate depicted in FIG. 2.

As illustrated in FIG. 4, FIG. 9, and FIG. 13, on the facing surface 51 of the protection substrate 4, housing recessed portions 52 are individually formed at positions facing to the piezoelectric element 9 in each piezoelectric element array. The ink supply path 53 is disposed at the upstream side in the ink flowing direction 41 with respect to each housing recessed portion 52, and the opening 54 is disposed at the downstream side. In the plan view, each housing recessed portion 52 is formed to have a rectangular shape a little bit larger than the pattern of the top portion electrode 13 corresponding to the piezoelectric element 9. Then, the corresponding piezoelectric element 9 is accommodated in each housing recessed portion 52.

Figure 11:
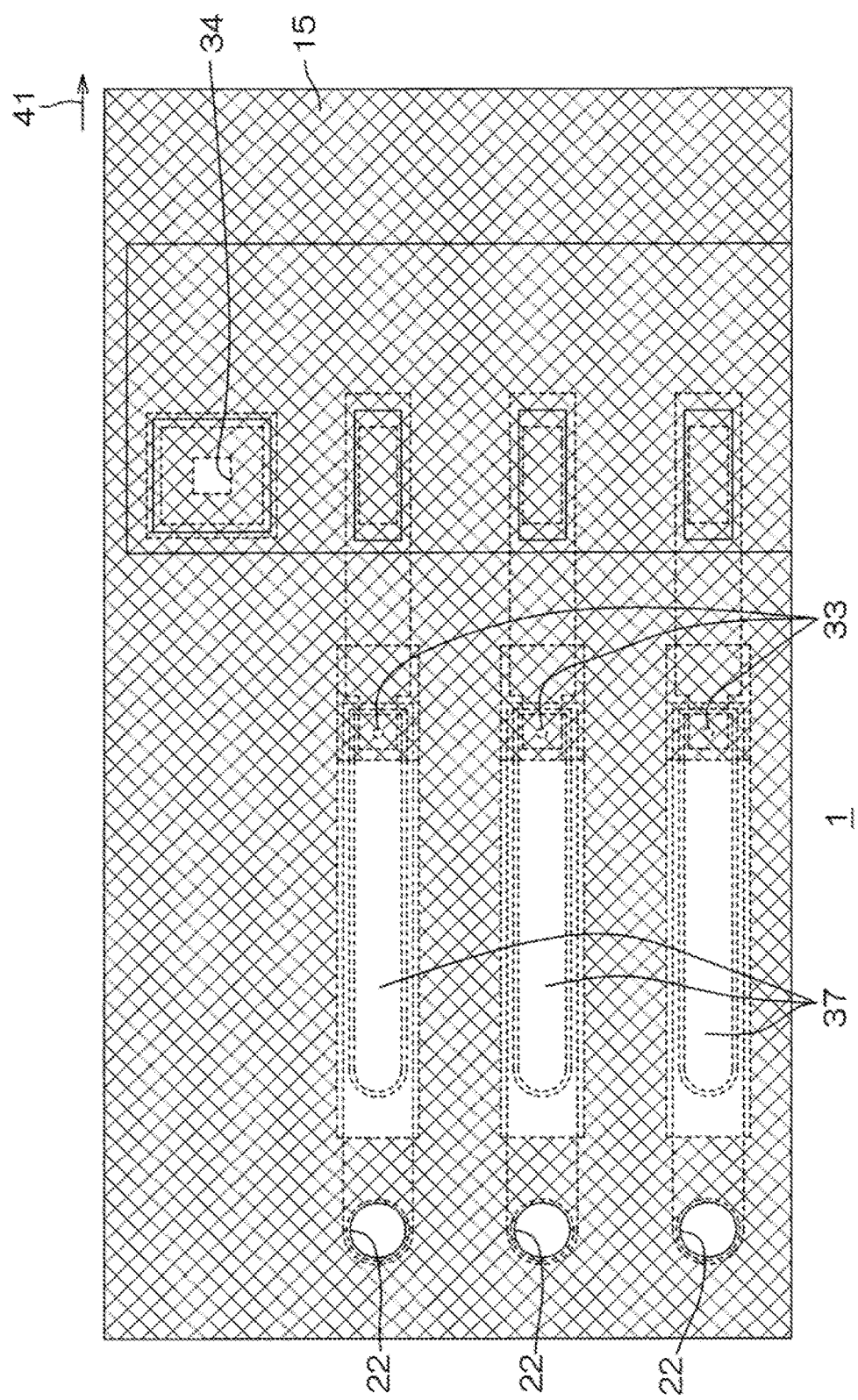
FIG. 11 is a schematic plan view of illustrating an exemplary pattern of an insulation film of the ink-jet print head, and is a plan view corresponding to FIG. 2.
Figure 12:
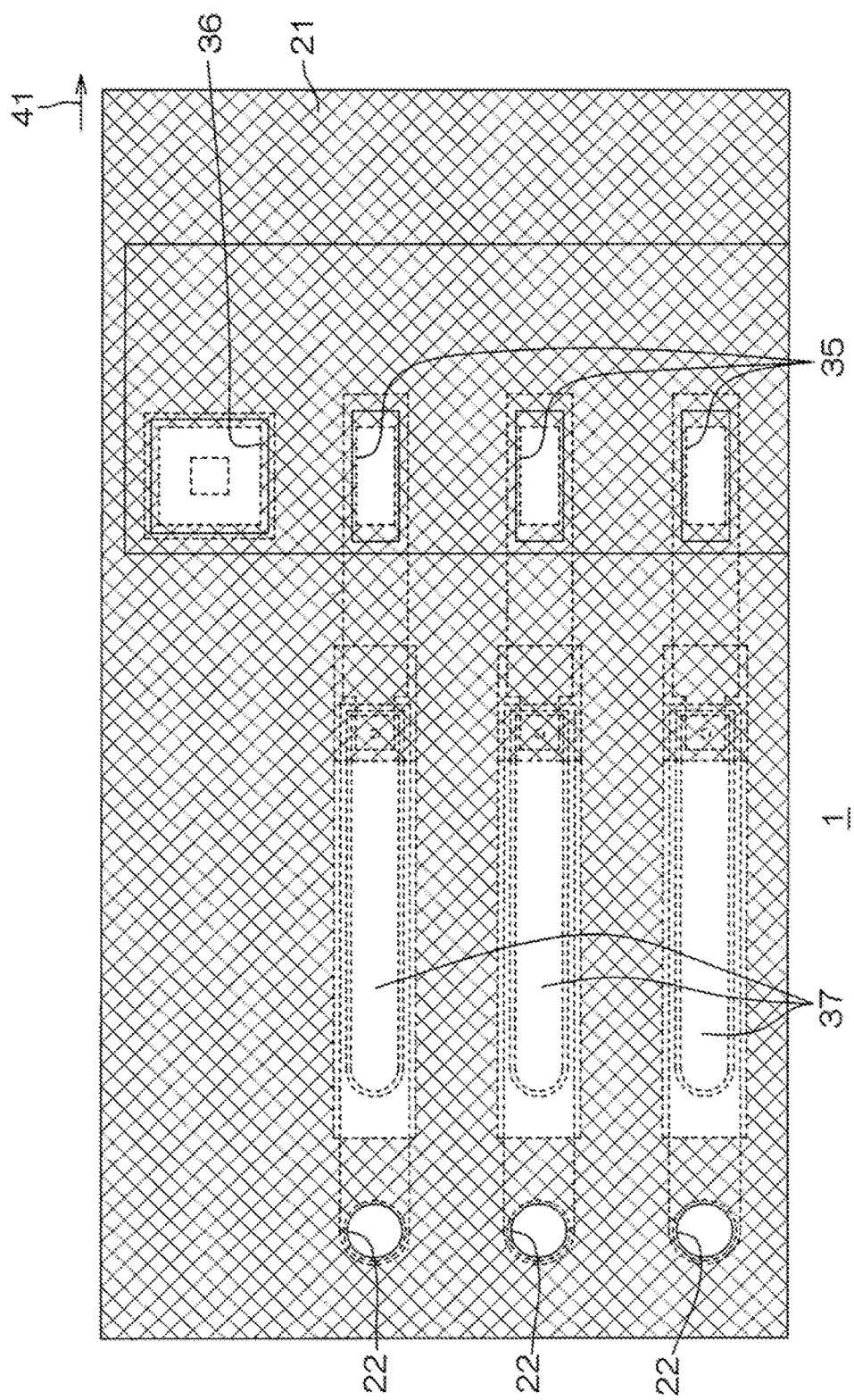
FIG. 12 is a schematic plan view of illustrating an exemplary pattern of a passivation film of the ink-jet print head, and is a plan view corresponding to FIG. 2.

FIG. 11 is a schematic plan view of illustrating an exemplary pattern of the insulation film of the ink-jet print head. FIG. 12 is a schematic plan view of illustrating an exemplary pattern of the passivation film of the ink-jet print head.

On the actuator substrate 2, the insulation film 15 and the passivation film 21 in the present embodiment are formed on approximately whole region of the outer side region of the housing recessed portion 52 of the protection substrate 4 in the plan view. It is noted, however, that the through hole for the ink supply 22 and the contact hole 34 are formed on the insulation film 15 in this region. In this region, the through hole for the ink supply 22, and the pad openings 35 and 36 are formed on the passivation film 21.

In the side region of the housing recessed portion 52 of the protection substrate 4, the insulation film 15 and the passivation film 21 may be formed only on one end portion (top portion wiring region) in which the top portion wiring 17 exists. In this region, the passivation film 21 is formed to cover the upper surface and the side surface of the top portion wiring 17 of the insulation film 15. In other words, an opening 37 is formed on the insulation film 15 and the passivation film 21 within the region of the side region of the housing recessed portion 52 other than the top portion wiring region in the plan view. On the insulation film 15, a contact hole 33 is further formed.

The summary of the method for producing the ink-jet print head 1 will be described.

Figure 14:
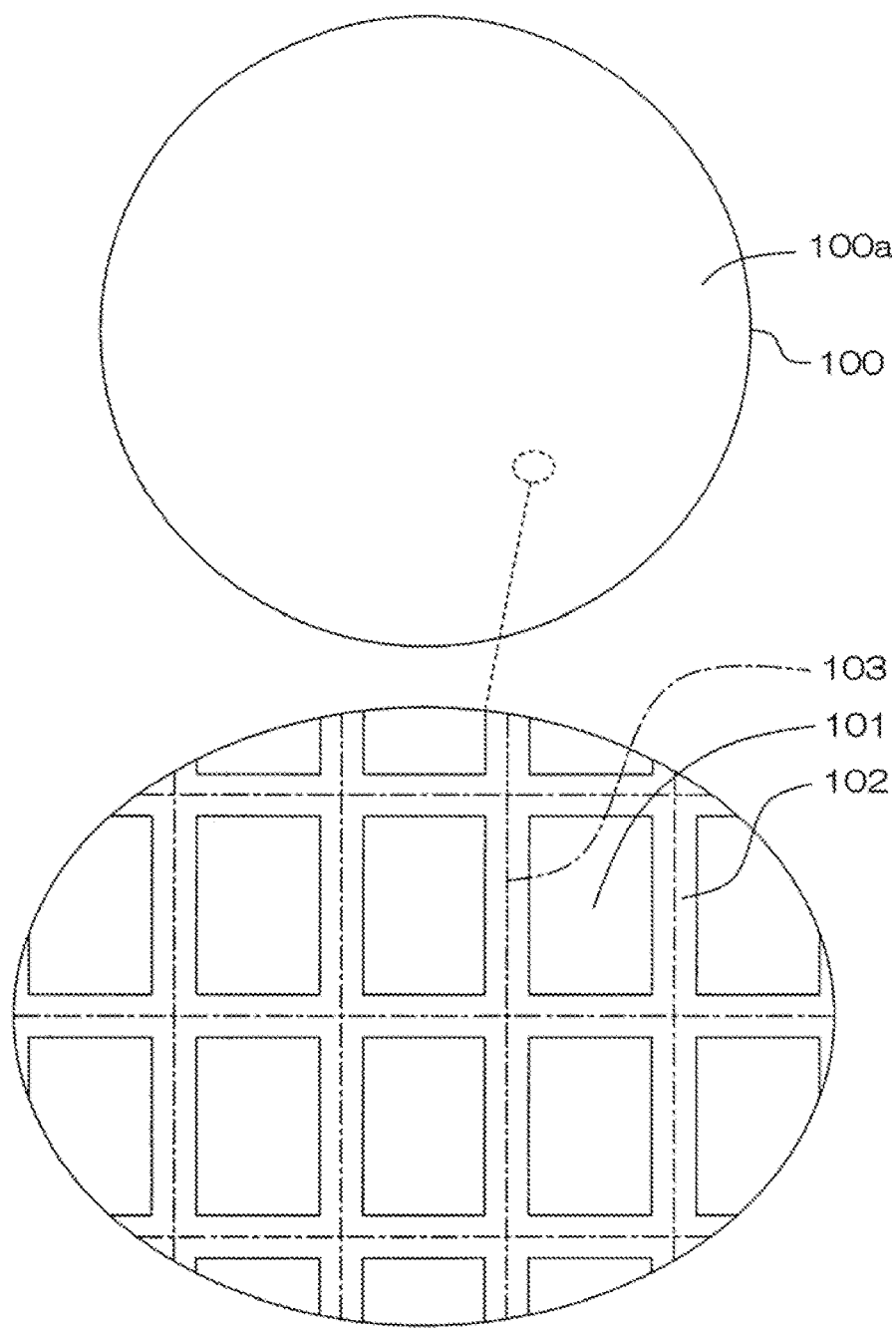
FIG. 14 is a plan view of a semiconductor wafer as an original substrate of an actuator substrate.

FIG. 14 is a plan view of a semiconductor wafer as an original substrate of an actuator substrate, and a partial region is enlarged.

A semiconductor wafer (actuator wafer) 100 as the original substrate of the actuator substrate 2 is, for example, consisted of a silicon wafer. A surface 100a of the actuator wafer 100 corresponds to the surface 2a of the actuator substrate. On the surface 100a of the actuator wafer 100, a plurality of functional-element forming regions 101 are arranged and set in a matrix. Between the adjacent functional-element forming regions 101, a scribing region (boundary region) 102 is disposed. The scribing region 102 is a belt-shaped region whose width is approximately constant, and is formed in a form of a grid extending in orthogonal two directions. On the scribing region 102, a scheduled cut line 103 is set. A necessary step is performed with respect to the actuator wafer 100 so as to prepare the substrate assembly aggregation (SA aggregation) 110 (see FIG. 15J), in which the ink flow path 5 is not formed but the configurations of the substrate assembly SA are formed on the respective functional-element forming regions 101.

A protection substrate aggregation 130 (see FIG. 15K) is prepared in advance that integrally includes a plurality of protection substrates 4 corresponding to the respective functional-element forming regions 101 of the substrate assembly aggregation 110. The protection substrate aggregation 130 is prepared by performing necessary steps with respect to the semiconductor wafer (wafer for the protection substrate) as the original substrate of the protection substrate 4. The wafer for the protection substrate is, for example, consisted of a silicon wafer.

In addition, a nozzle substrate aggregation 150 (see FIG. 15M and FIG. 16G) is prepared in advance that integrally includes a plurality of nozzle substrates 3 corresponding to the respective functional-element forming regions 101 of the substrate assembly aggregation 110. The nozzle substrate aggregation 150 is prepared by performing necessary steps with respect to the semiconductor wafer (nozzle wafer) as the original substrate of the nozzle substrate 3. The nozzle wafer is, for example, consisted of a silicon wafer. As illustrated in FIG. 15M and FIG. 16G, the nozzle substrate aggregation 150 is consisted of a nozzle wafer 140, a silicon oxide (SiO2) film 142 formed on one surface of the nozzle wafer 140, and a water repellent film 143 formed on the surface of the silicon oxide film 142.

When the substrate assembly aggregation 110 is prepared, the protection substrate aggregation 130 is joined to the substrate assembly aggregation 110. Next, the ink flow path 5 is formed on the substrate assembly aggregation 110. Next, the nozzle substrate aggregation 150 is joined to the substrate assembly aggregation 110. Thus, the ink-jet print head aggregation 170 (see FIG. 15M) is obtained that is consisted of the substrate assembly aggregation 110, the protection substrate aggregation 130, and the nozzle substrate aggregation 150. Then, the ink-jet print head aggregation 170 is cut (subjected to dicing) along the scheduled cut line 103 by a dicing blade. Thus, each of the individual ink-jet print heads (chips) 1 including the functional-element forming regions 101 are cut out. The ink-jet print head 1 includes the scribing region 102 at the circumference edge portion, and the functional-element forming region 101 at the center region surrounded by the scribing region 102.

In the following description, the method for producing the ink-jet print head 1 will be described in detail.

FIGS. 15A, 15B, 15C, 15D, 15E, 15F, 15G, 15H, 15I, 15J, 15K, 15L and 15M are transverse sectional views illustrating the production step of the ink-jet print head 1, and transverse sectional views corresponding to the cut surface of FIG. 4.

First, the actuator wafer 100 is prepared as illustrated in FIG. 15A. It is noted, however, that the actuator wafer 100 thicker than the thickness of the final actuator substrate 2 is used. Then, the movable film form layer 10 is formed on the surface 100a of the actuator wafer 100. Specifically, a silicon oxide film (for example, 1.2 µm thickness) is formed on the surface 100a of the actuator wafer 100. In the case that the movable film form layer 10 is consisted of a stack film including a silicon film, a silicon oxide film, and a silicon nitride film, a silicon film (for example, 0.4 µm thickness) is formed on the surface of the actuator substrate 2, a silicon oxide film (for example, 0.4 µm thickness) is formed on the silicon film, and the silicon nitride film (for example, 0.4 µm thickness) is formed on the silicon oxide film.

Next, the metal barrier film 8 is formed on the movable film form layer 10. The metal barrier film 8 is, for example, consisted of an Al2O3 film (for example, 50 to 100 nm thickness). The metal barrier film 8 suppresses metal atoms from breaking out from the piezoelectric film 12 that is formed later. When the metal atoms breaks out, the piezoelectric property of the piezoelectric film 12 may be deteriorated. In addition, when the breaking-out metal atoms are contaminated in the silicon layer configuring the movable film 10A, the durability of the movable film 10A may be deteriorated.

Figure 15B:
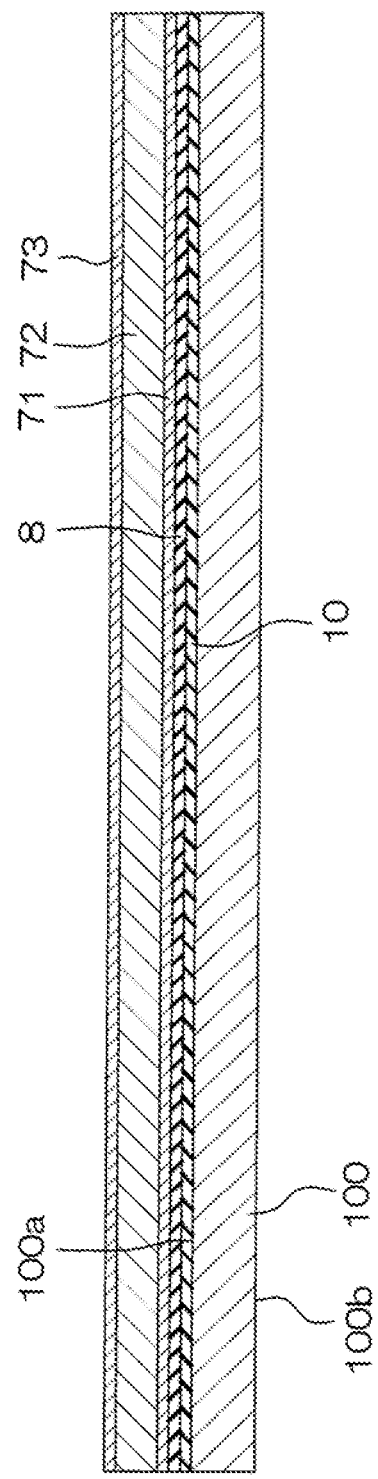
FIG. 15B is a transverse sectional view illustrating a next step of FIG. 15A.

Next, as illustrated in FIG. 15B, the bottom portion electrode film 71 being the material layer of the bottom portion electrode 11 is formed on the metal barrier film 8. The bottom portion electrode film 71 is, for example, consisted of a Pt/Ti stack film which includes a Ti film (for example, 10 to 40 nm thickness) as the bottom layer and a Pt film (for example, 10 to 400 nm thickness) as the top layer. This kind of the bottom portion electrode film 71 may also be formed by a sputtering method.

Next, a piezoelectric material film 72 being a material of the piezoelectric film 12 is formed on the entire surface of the bottom portion electrode film 71. Specifically, for example, the piezoelectric material film 72 having 1 to 3 μm thickness is formed by a sol-gel method. This kind of the piezoelectric material film 72 is consisted of a sintered body of the metal oxide crystal grain.

Next, a top portion electrode film 73 being a material of the top portion electrode 13 is formed on the entire surface of the piezoelectric material film 72. The top portion electrode film 73 may be, for example, a single film of platinum (Pt). The top portion electrode film 73 may be, for example, an IrO2/Ir stack film which includes an IrO2 film (for example, 40 to 160 nm thickness) as the bottom layer and an Ir film (for example, 40 to 160 nm thickness) as the top layer. This kind of the top portion electrode film 73 may also be formed by a sputtering method.

Figure 15C:
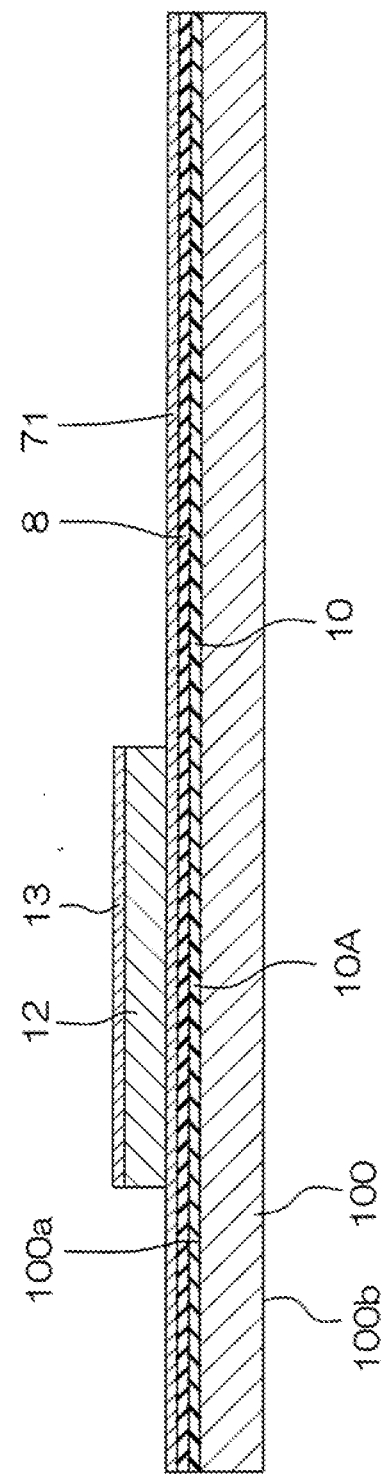
FIG. 15C is a transverse sectional view illustrating a next step of FIG. 15B.
Figure 15D:
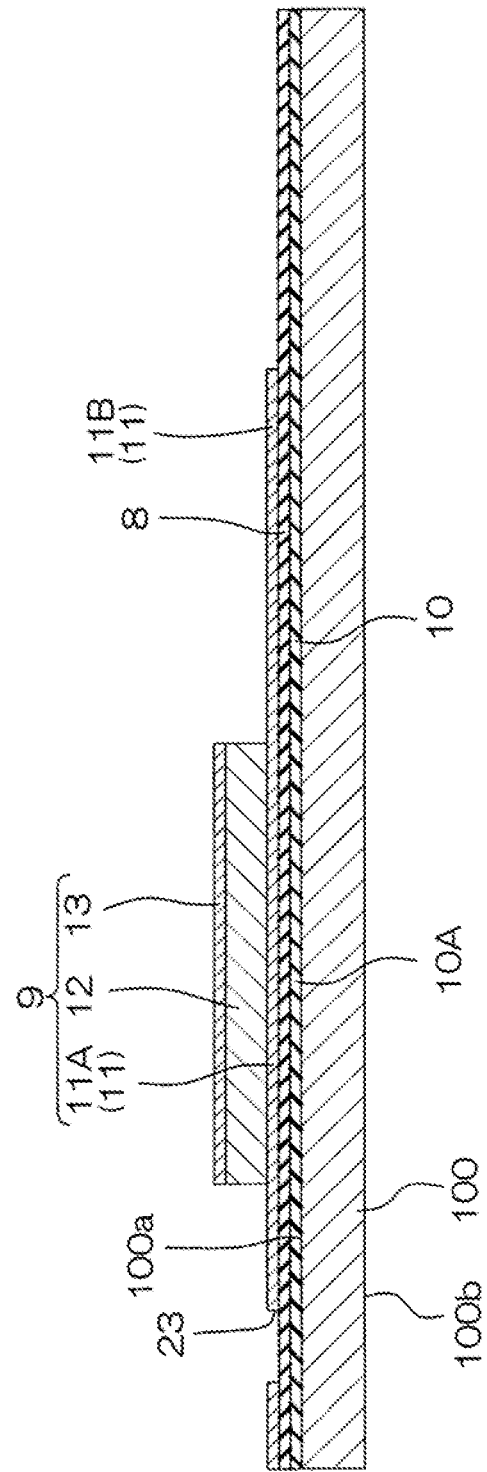
FIG. 15D is a transverse sectional view illustrating a next step of FIG. 15C.

Next, as illustrated in FIG. 15C and FIG. 15D, patternings of the top portion electrode film 73, the piezoelectric material film 72, and the bottom portion electrode film 71 are performed. First, by photolithography, the resist mask of the pattern of the top portion electrode 13 is formed. Then, as illustrated in FIG. 15C, this resist mask is used as the mask and thus the top portion electrode film 73 and the piezoelectric material film 72 are subjected to etching in sequence, so that predetermined patterns of the top portion electrode 13 and the piezoelectric film 12 are formed.

Next, after the resist mask is separated, the resist mask of the pattern of the bottom portion electrode 11 is formed by photolithography. Then, as illustrated in FIG. 15D, this resist mask is used as the mask and thus the bottom portion electrode film 71 is subjected to etching, so that a predetermined pattern of the bottom portion electrode 11 is formed. This ensures that, the bottom portion electrode 11 consisted of the main electrode portion 11A and the extending portion 11B including the through hole 23 is formed. Thus, the piezoelectric element 9 is formed that is consisted of the main electrode portion 11A of the bottom portion electrode 11, the piezoelectric film 12, and the top portion electrode 13.

Figure 15E:
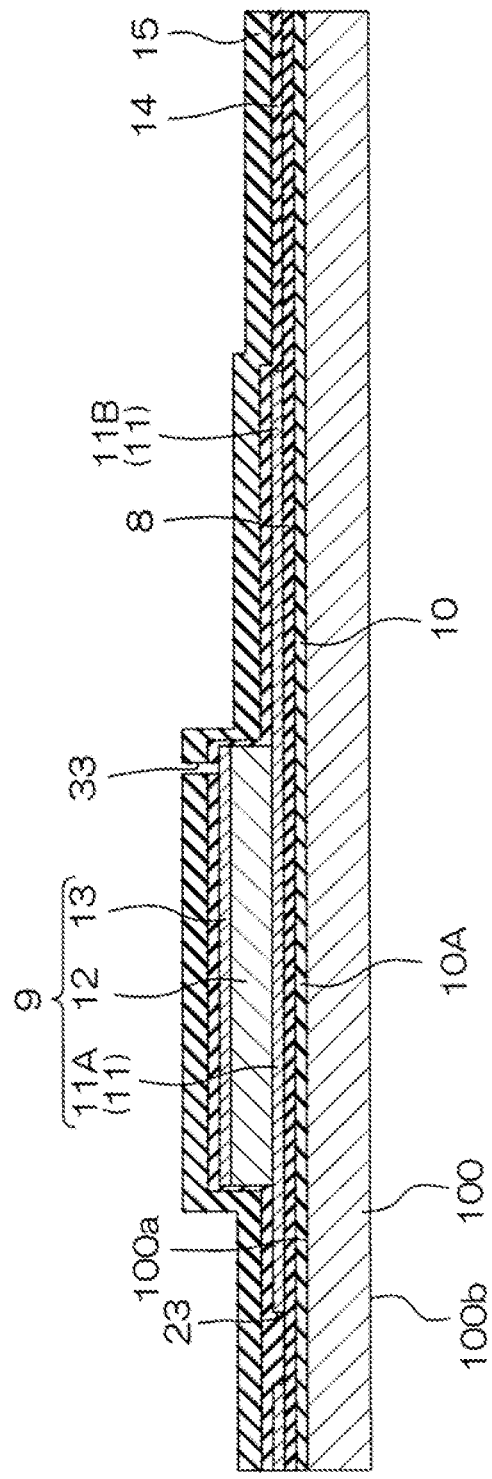
FIG. 15E is a transverse sectional view illustrating a next step of FIG. 15D.

Next, as illustrated in FIG. 15E, after the resist mask is separated, the hydrogen barrier film 14 covering the entire surface is formed. The hydrogen barrier film 14 may be an Al2O3 film formed by a sputtering method, and the film thickness may be 50 to 100 nm. Then, the insulation film 15 is formed on the entire surface of the hydrogen barrier film 14. The insulation film 15 may be an SiO2 film, and the film thickness may be 200 to 300 nm. Next, the insulation film 15 and the hydrogen barrier film 14 are subjected to etching in sequence so as to form the contact holes 33 and 34.

Figure 15F:
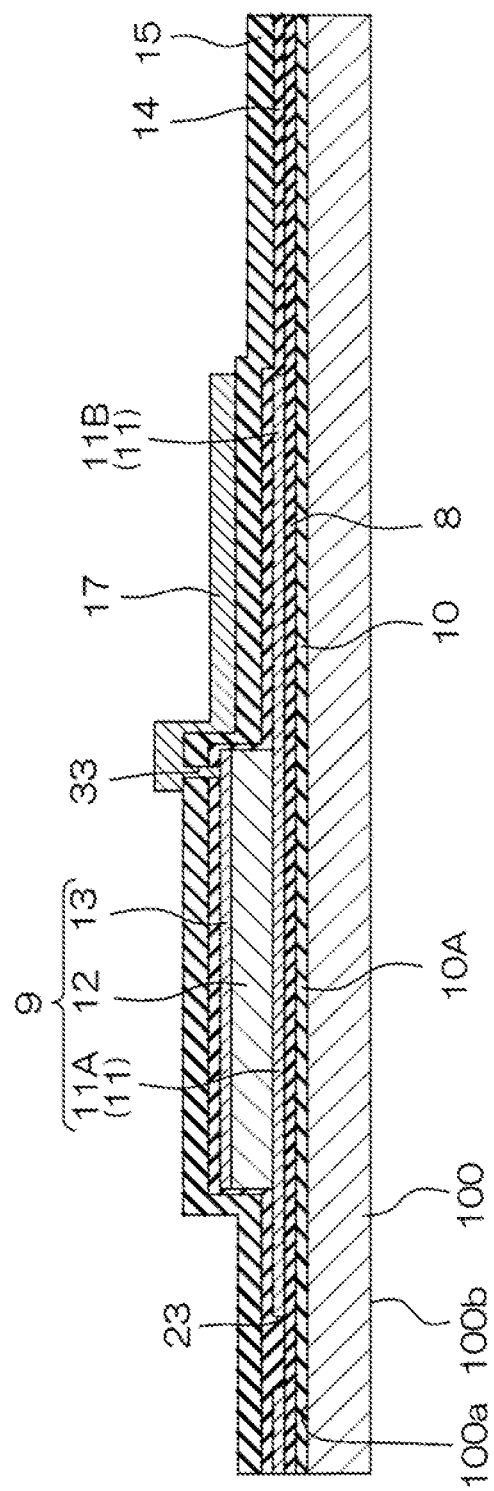
FIG. 15F is a transverse sectional view illustrating a next step of FIG. 15E.

Next, as illustrated in FIG. 15F, a wiring film configuring the top portion wiring 17 and the bottom portion wiring 18 is formed on the insulation film 15 including the insides of the contact holes 33 and 34 by a sputtering method. Then, by photolithography and etching, the wiring film is subjected to patterning so that the top portion wiring 17 and the bottom portion wiring 18 are simultaneously formed.

Figure 15G:
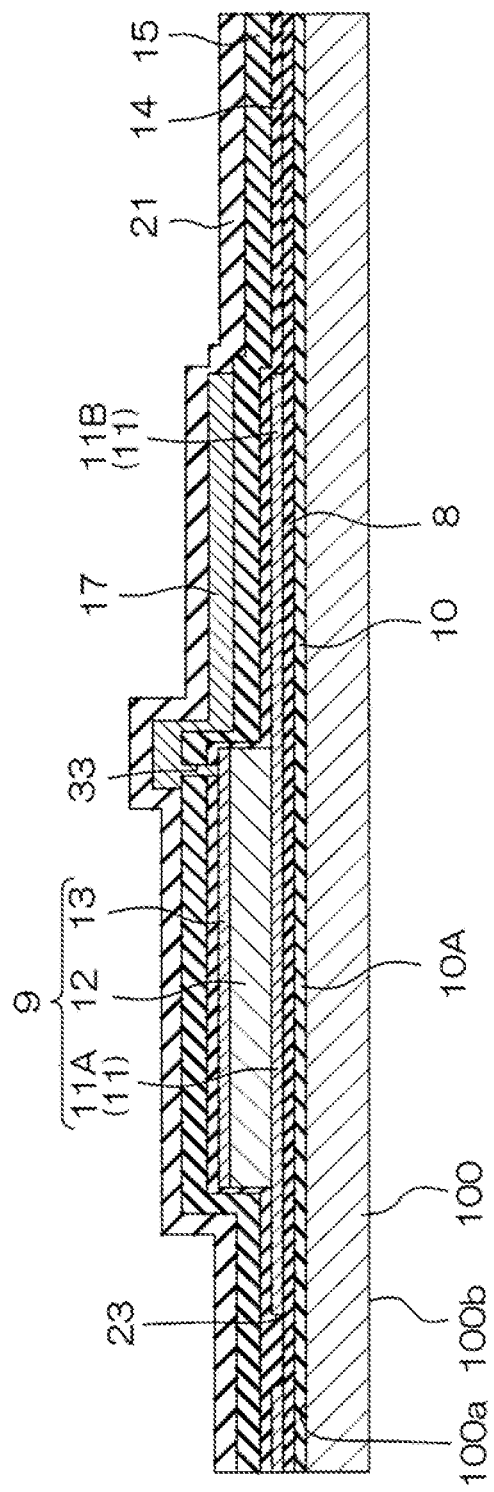
FIG. 15G is a transverse sectional view illustrating a next step of FIG. 15F.

Next, as illustrated in FIG. 15G, the passivation film 21 is formed on the surface of the insulation film 15 to cover the respective wirings 17 and 18. The passivation film 21 is, for example, made of SiN. The passivation film 21 is formed, for example, by plasma chemical vapor deposition (CVD).

Figure 15H:
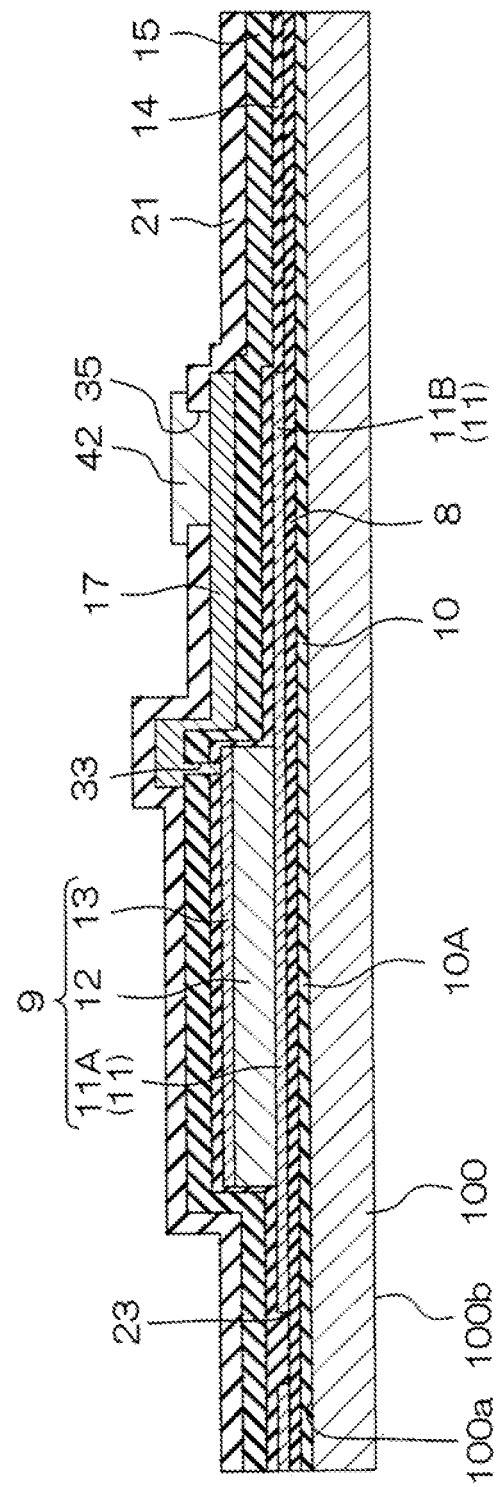
FIG. 15H is a transverse sectional view illustrating a next step of FIG. 15G.

Next, a resist mask including openings corresponding to the pad openings 35 and 36 is formed by photolithography, and this resist mask is used as the mask so that the passivation film 21 is subjected to etching. This ensures that, as illustrated in FIG. 15H, the pad openings 35 and 36 are formed on the passivation film 21. After the resist mask is separated, the pad for the top portion electrode 42 and the pad for the bottom portion electrode 43 are individually formed on the passivation film 21 through the pad openings 35 and 36.

Figure 15I:
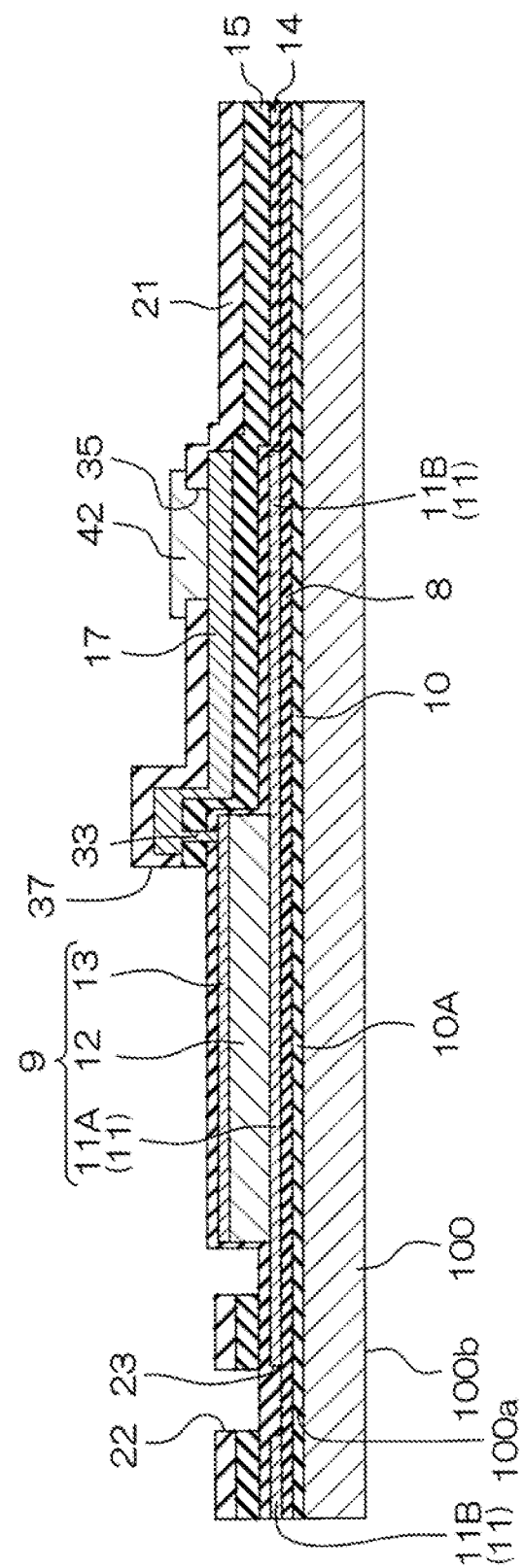
FIG. 15I is a transverse sectional view illustrating a next step of FIG. 15H.

Next, the resist mask including an opening corresponding to the opening 37 and the through hole for the ink supply 22 is formed by photolithography, and this the resist mask is used as the mask so that the passivation film 21 and the insulation film 15 are subjected to etching in sequence. This ensures that, as illustrated in FIG. 15I, the opening 37 and the through hole for the ink supply 22 are formed on the passivation film 21 and the insulation film 15.

Figure 15J:
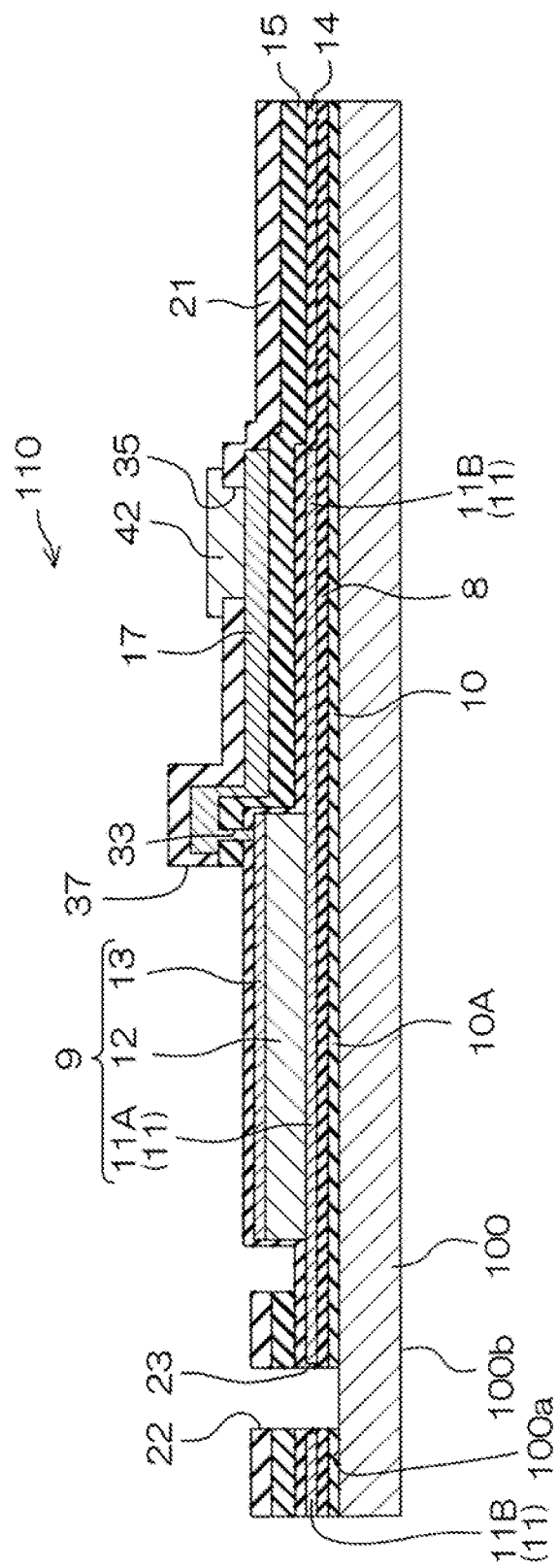
FIG. 15J is a transverse sectional view illustrating a next step of FIG. 15I.

Next, the resist mask is separated. Then, the resist mask including an opening corresponding to the through hole for the ink supply 22 is formed by photolithography, and this resist mask is used as the mask, so that the hydrogen barrier film 14, the metal barrier film 8, and the movable film form layer 10 are subjected to the etching. This ensures that, as illustrated in FIG. 15J, the through hole for the ink supply 22 is formed on the hydrogen barrier film 14, the metal barrier film 8, and the movable film form layer 10. This ensures that, the substrate assembly aggregation 110 is prepared.

Figure 15K:
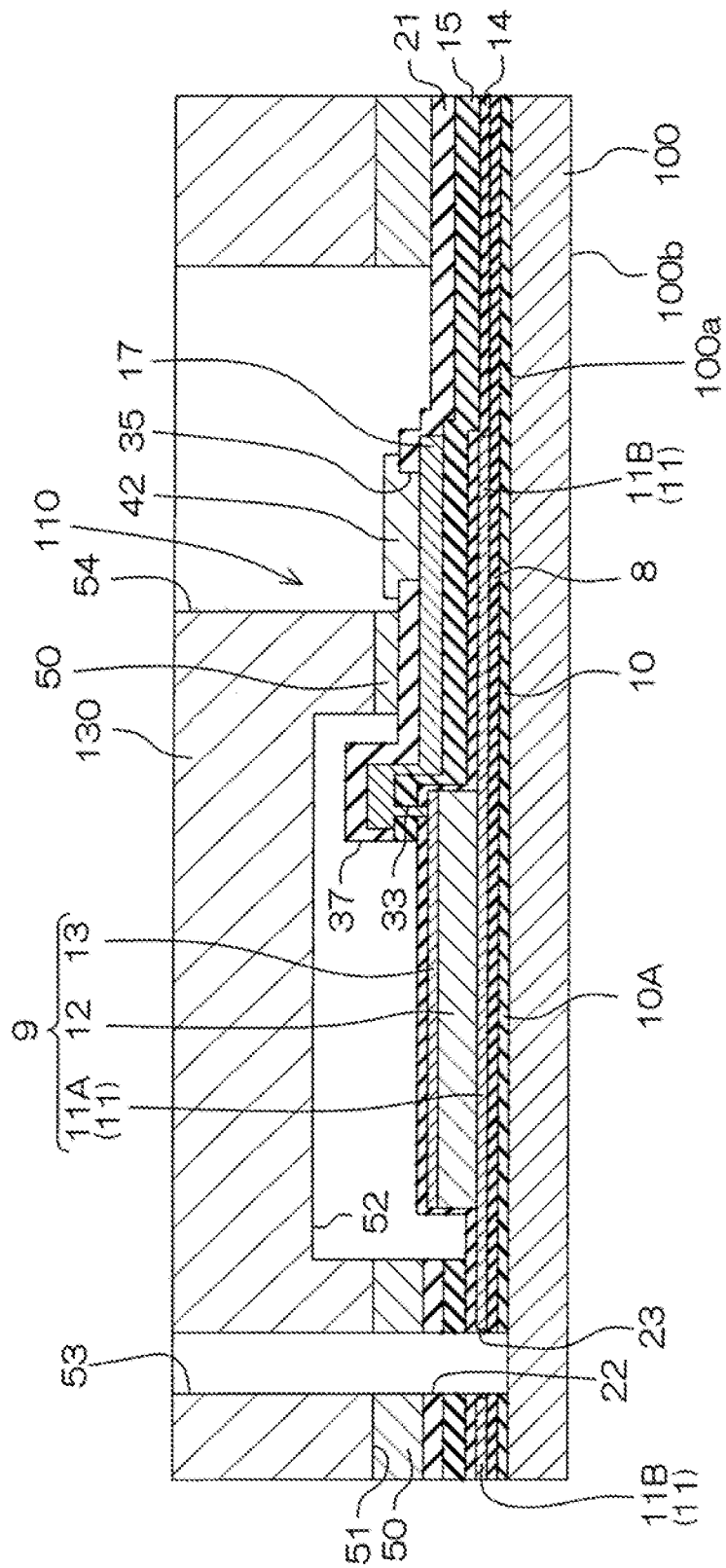
FIG. 15K is a transverse sectional view illustrating a next step of FIG. 15J.

Next, as illustrated in FIG. 15K, the adhesive agent 50 is applied to the facing surface 51 of the protection substrate aggregation 130, and the protection substrate aggregation 130 is secured to the substrate assembly aggregation 110 so that the ink supply path 53 matches the corresponding through hole for the ink supply 22.

Figure 15L:
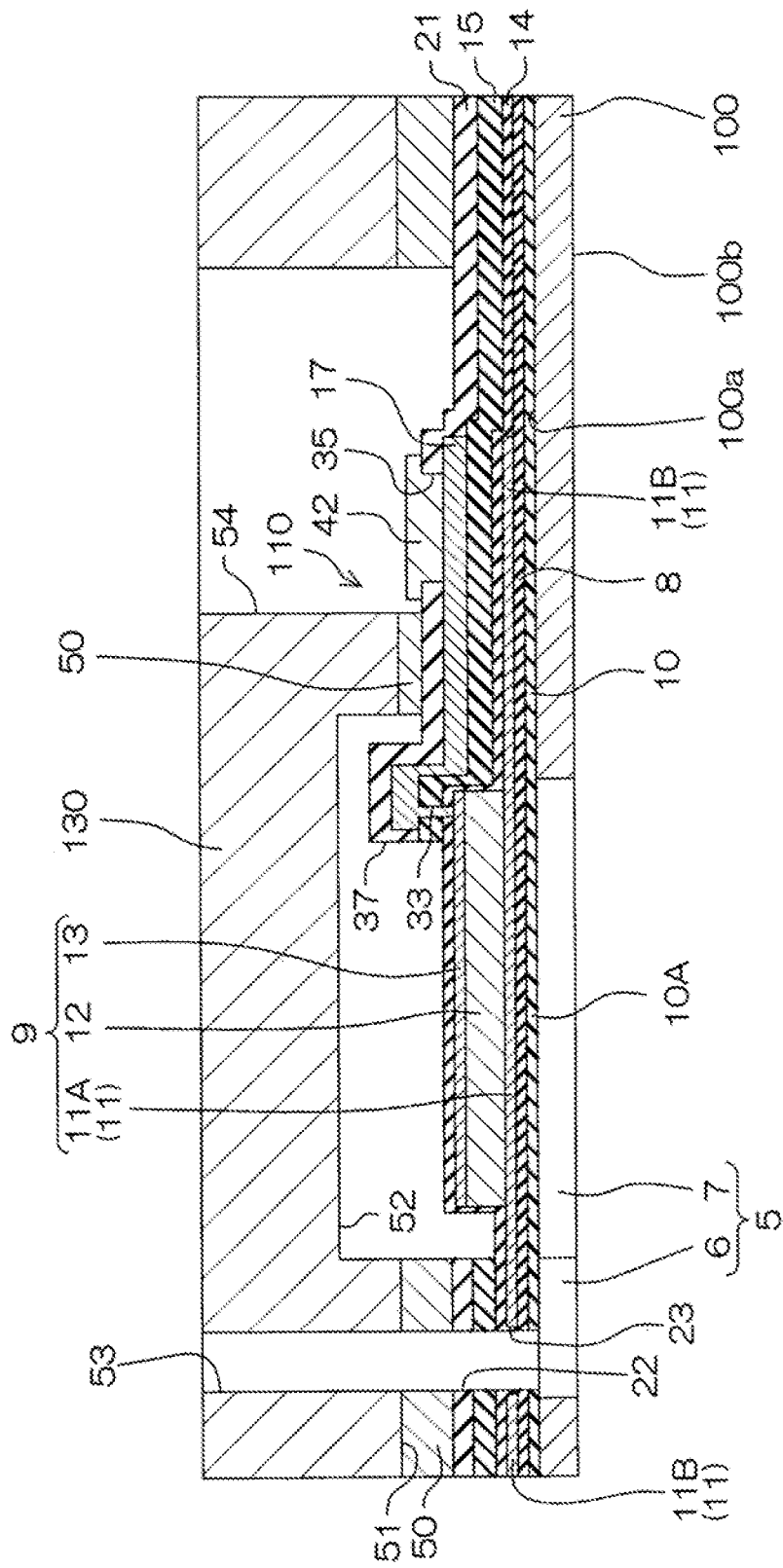
FIG. 15L is a transverse sectional view illustrating a next step of FIG. 15K.
Figure 15M:
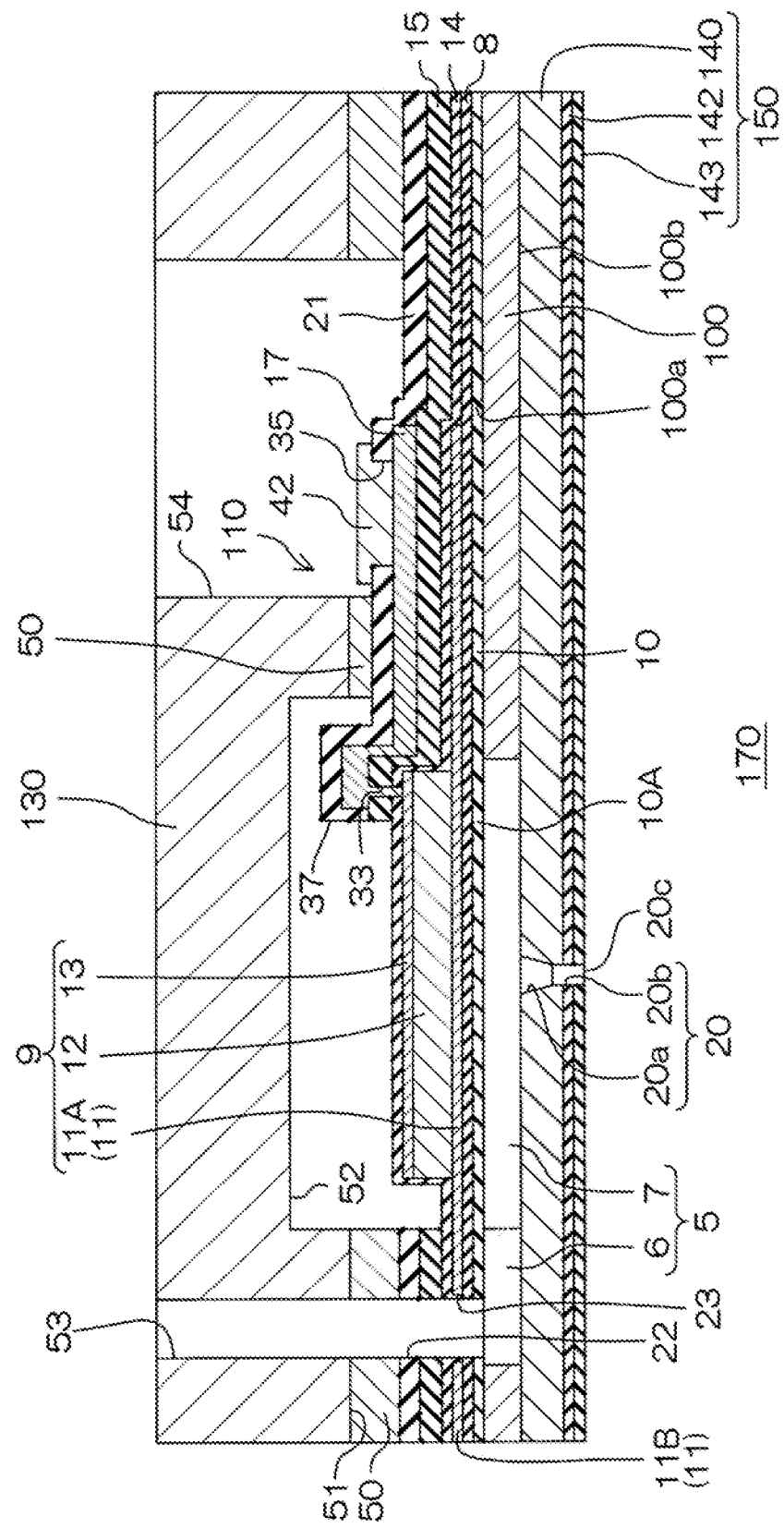
FIG. 15M is a transverse sectional view illustrating a next step of FIG. 15L.

Next, as illustrated in FIG. 15L, rear-surface grinding is performed to thin the actuator wafer 100. The actuator wafer 100 is polished from the rear surface 100b, so that the actuator wafer 100 is subjected to film thinning. For example, the actuator wafer 100 having approximately 670 μm thickness at the initial state may be thinned to have approximately 300 μm thickness. Then, the resist mask including the opening corresponding to the ink flow path 5 (ink inflowing portion 6 and pressure chamber 7) is formed at the rear surface 100b side of the actuator wafer 100 by photolithography, and this resist mask is used as the mask, so that the actuator wafer 100 is subjected to etching from the rear surface 100b. This ensures that, the ink flow path 5 (ink inflowing portion 6 and pressure chamber 7) is formed on the actuator wafer 100.

At the time of performing this etching, the metal barrier film 8 formed on the surface of the movable film form layer 10 suppresses metal elements (Pb, Zr, and Ti in the case of PZT) from breaking out from the piezoelectric film 12, so that the piezoelectric property of the piezoelectric film 12 is kept in a satisfactory manner. In addition, as described above, the metal barrier film 8 contributes to durability maintenance of the silicon layer forming the movable film 10A.

Then, as illustrated in FIG. 15M, the nozzle substrate aggregation 150 is stacked on the rear surface 100b of the actuator wafer 100. This ensures that, the ink-jet print head aggregation 170 is obtained that is consisted of the substrate assembly aggregation 110, the protection substrate aggregation 130, and the nozzle substrate aggregation 150. Then, the ink-jet print head aggregation 170 is cut along the scheduled cut line 103 by a dicing blade. That is, a step is performed to individually cut out the ink-jet print head 1.

When this step is completed, the actuator wafer 100 of the substrate assembly aggregation 110 becomes the actuator substrate 2 of the individual ink-jet print head 1. In addition, the protection substrate aggregation 130 becomes the protection substrate 4 of the individual ink-jet print head 1. In addition, the nozzle wafer 140, the silicon oxide film 142, and the water repellent film 143 of the nozzle substrate aggregation 150 become the silicon substrate 30, the silicon oxide film 31, and the water repellent film 32 of the nozzle substrate 3 of the individual ink-jet print head 1. Thus, individual pieces of the ink-jet print head 1 structure illustrated in FIG. 1 to FIG. 10 are obtained.

On the ink-jet print head 1 obtained as described above, the side surface of the actuator substrate 2 and the side surface of the nozzle substrate 3 become flush in all directions in the plan view (flush over the entire periphery). That is, in the present embodiment, the ink-jet print head 1 is obtained that includes no level difference between the actuator substrate 2 and the nozzle substrate 3. In addition, in the present embodiment, the side surface of the actuator substrate 2 and the side surface of the protection substrate 4 also become flush in all directions in the plan view (flush over the entire periphery). That is, in the present embodiment, the ink-jet print head 1 is obtained that includes no level difference between the actuator substrate 2 and the protection substrate 4.

By the method in the present embodiment for producing the ink-jet print head, the nozzle substrate aggregation 150 is joined to the substrate assembly aggregation 110 to which the protection substrate aggregation 130 is secured, so as to prepare the ink-jet print head aggregation 170. Then, when the ink-jet print head aggregation 170 is subjected to dicing, the ink-jet print head 1 is individually cut out. Thus, it is possible to efficiently produce the ink-jet print head 1 as compared, for example, with the case where the individual substrate assembly SA is produced and then the nozzle substrate 3 is individually joined to the individual substrate assembly SA so as to produce the ink-jet print head.

FIGS. 16A, 16B, 16C, 16D, 16E, 16F and 16G are transverse sectional views schematically illustrating the production step of the nozzle substrate aggregation 150, and are transverse sectional views cut in a direction orthogonal to the ink flowing direction and cut along the cut line passing the center of the nozzle hole.

Figure 16A:
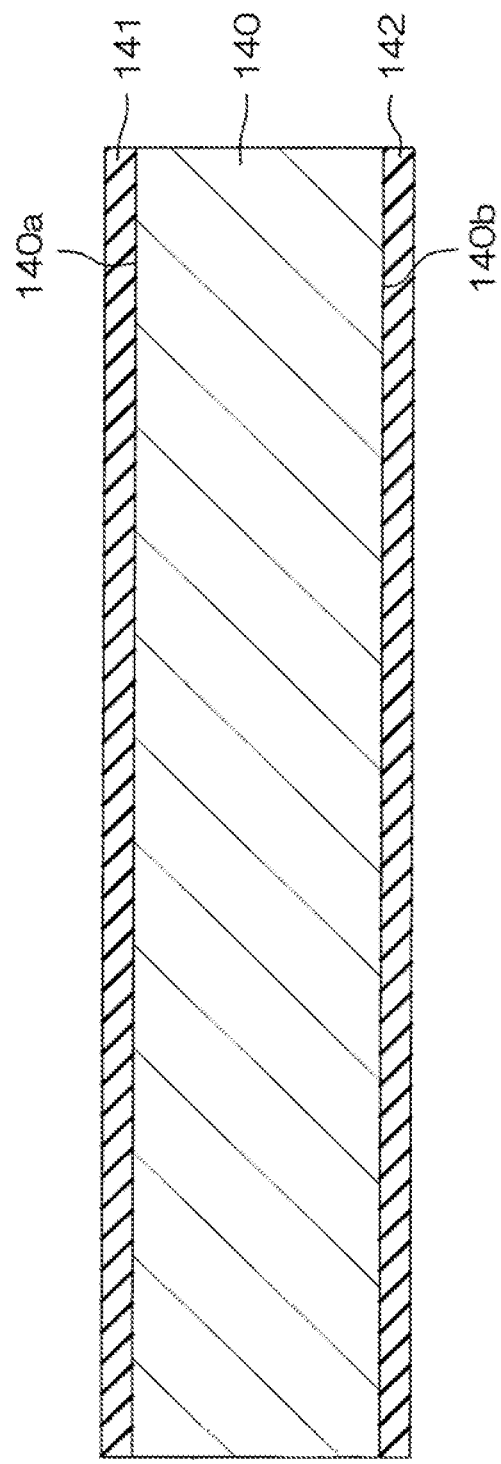
FIG. 16A is a transverse sectional view schematically illustrating a production step of a nozzle substrate aggregation, and is a transverse sectional view cut in a direction orthogonal to an ink flowing direction and cut along a cut line passing the center of the nozzle hole.

First, as illustrated in FIG. 16A, the semiconductor wafer (nozzle wafer) 140 is prepared as the original substrate of the nozzle substrate 3. It is noted, however, that the nozzle wafer 140 thicker than the thickness of the final nozzle substrate 3 is used. The nozzle wafer 140 is consisted of a silicon wafer. The nozzle wafer 140 has a surface (first surface) 140a as the side facing to the rear surface 2b of the actuator substrate 2 and a rear surface (second surface) 140b at the opposite side. The both surfaces 140a and 140b of the nozzle wafer 140 are subjected to heat oxidation, so that the silicon oxide (SiO2) films 141 and 142 are formed on the both surfaces 140a and 140b of the nozzle wafer 140.

Figure 16B:
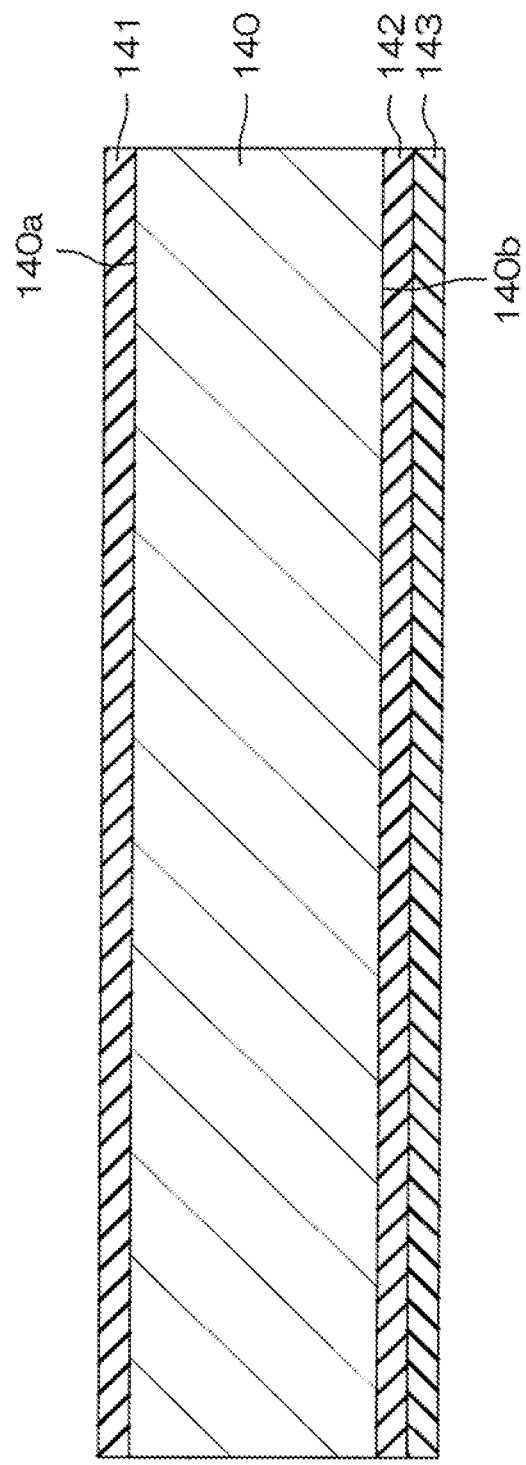
FIG. 16B is a transverse sectional view illustrating a next step of FIG. 16A.

Next, as illustrated in FIG. 16B, the water repellent film 143 is formed on the surface of the silicon oxide film 142 at the rear surface 140b side of the nozzle wafer 140 by a spin coating method or an evaporation method.

Figure 16C:
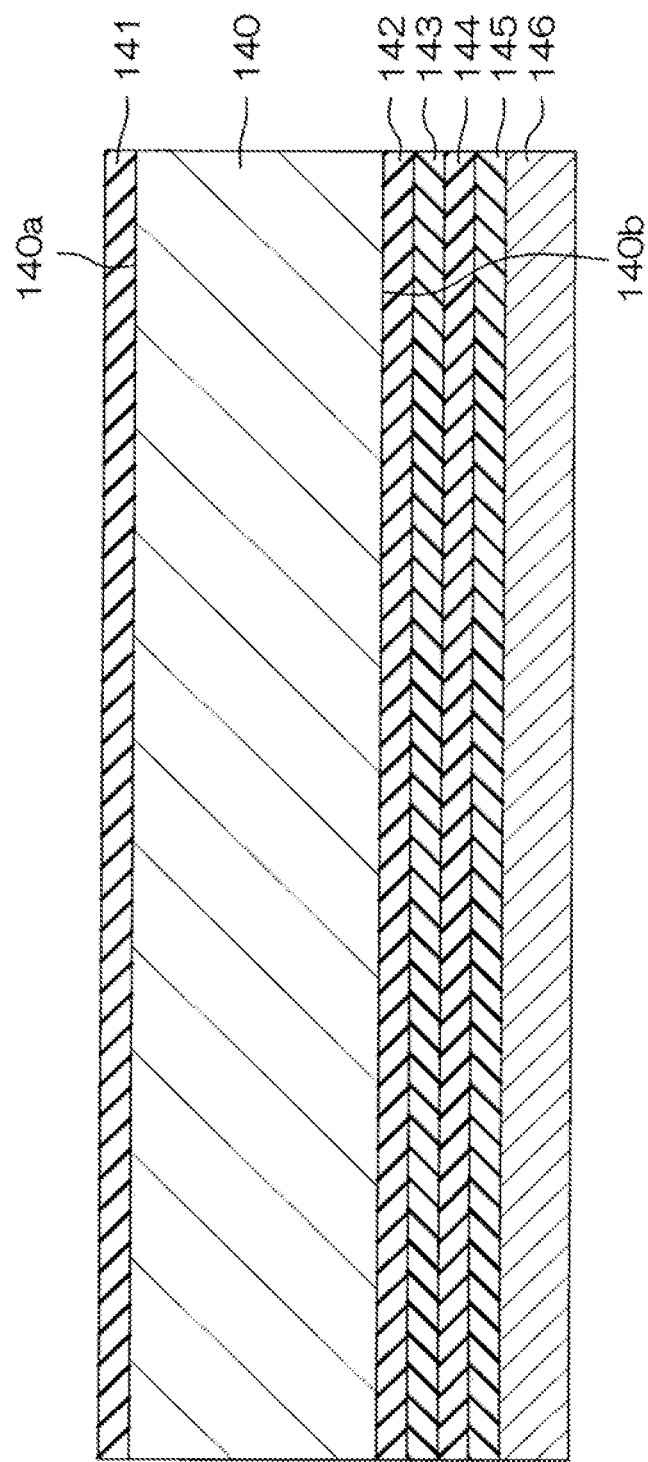
FIG. 16C is a transverse sectional view illustrating a next step of FIG. 16B.

Next, as illustrated in FIG. 16C, a support wafer 146 is pasted on the surface of the water repellent film 143 through a protection tape 144 and a heat separation tape 145. The protection tape 144 is, for example, a kapton (registered trademark) tape in which silicone system gluing agent is applied to polyimide. The heat separation tape 145 is a tape separated in response to heat addition, and is consisted of, for example, of a heat foaming separation gluing tape including foaming agent. The support wafer 146 is consisted of a silicon wafer.

Figure 16D:
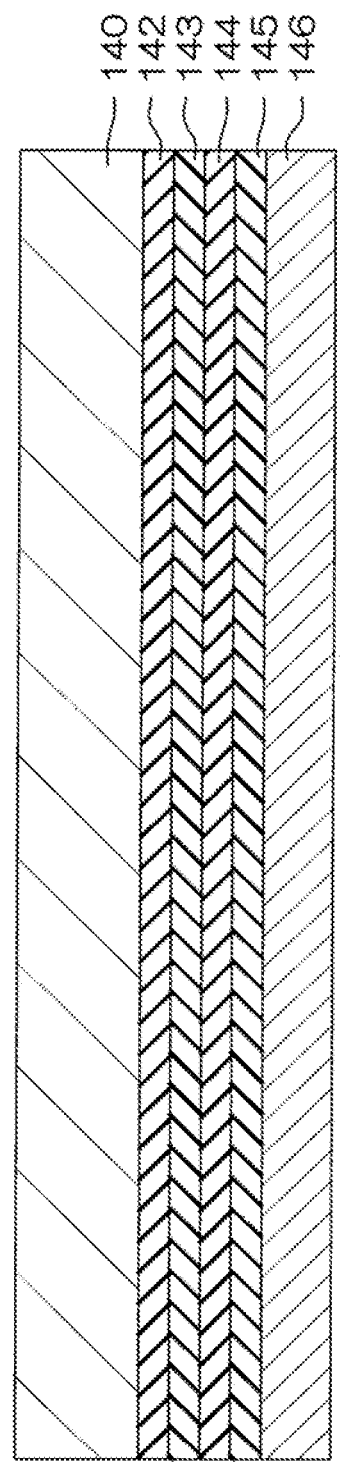
FIG. 16D is a transverse sectional view illustrating a next step of FIG. 16C.

Next, as illustrated in FIG. 16D, the nozzle wafer 140 is polished from the silicon oxide film 141 side (surface 140a side of the nozzle wafer 140) so that the nozzle wafer 140 is subjected to film thinning. For example, the nozzle wafer 140 having approximately 625 μm thickness at the initial state may be subjected to thinning to have approximately 40 μm thickness.

Next, as illustrated in FIG. 16E, the resist mask 147 including the opening 147a corresponding to the nozzle hole 20 (ink ejecting path 20b) is formed by photolithography, and this resist mask 147 is used as the mask so that the nozzle wafer 140 is subjected to dry etching from the surface. This ensures that, the recessed part 20a is formed on the surface of the nozzle wafer 140, and the first ink ejecting path 20b1 is formed on the bottom surface of the recessed part 20a. Specifically, for example, first, the anisotropic etching is gradually increased from the isotropic etching so as to form the recessed part 20a having the truncated cone shape. Then, the solid cylindrical first ink ejecting path 20b1 is formed, for example, by Bosch process. It is noted that the recessed part 20a may be formed by the isotropic etching and the first ink ejecting path 20b1 may be formed by the anisotropic etching. The recessed part 20a has a truncated cone shape whose transverse section is gradually reduced from the surface 140a side of the nozzle wafer 140 to the silicon oxide film 142 side.

Figure 16F:
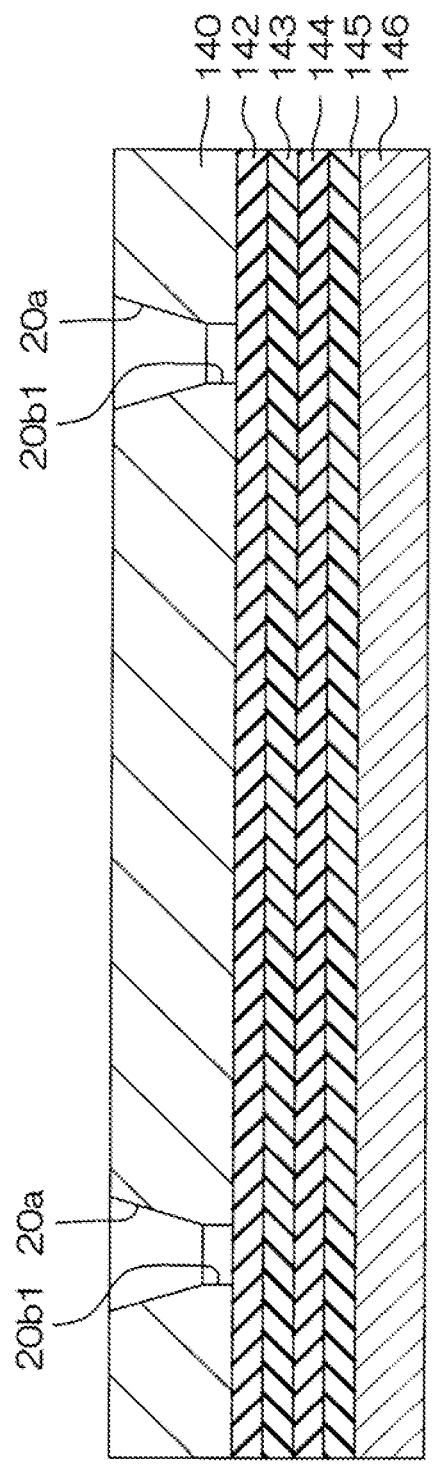
FIG. 16F is a transverse sectional view illustrating a next step of FIG. 16E.
Figure 16G:
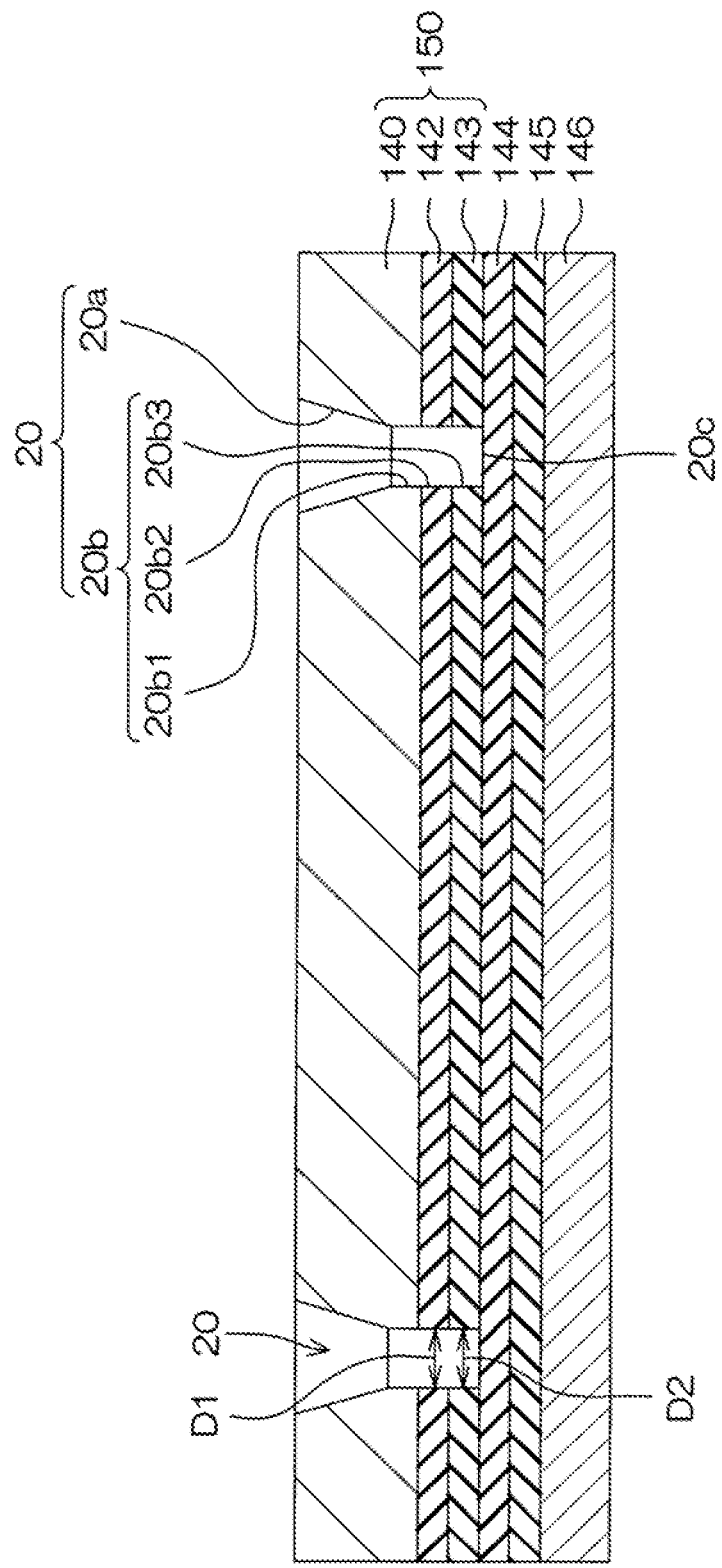
FIG. 16G is a transverse sectional view illustrating a next step of FIG. 16F.

Next, as illustrated in FIG. 16F, ashing processing for removing the resist mask 147 is performed so that the resist mask 147 is removed. At that time, the silicon oxide film 142 works as a barrier film, and thus the water repellent film 143 rarely takes influence of the ashing gas.

Next, as illustrated in FIG. 16G, the nozzle wafer 140 is used as the hard mask, and the silicon oxide film 142 and the water repellent film 143 are subjected to etching in sequence. In the present embodiment, the etchings of the silicon oxide film 142 and the water repellent film 143 are anisotropic dry etchings. This ensures that, the second ink ejecting path 20b2 connecting to the first ink ejecting path 20b1 is formed on the silicon oxide film 142, and then the third ink ejecting path 20b3 connecting to the second ink ejecting path 20b2 is formed on the water repellent film 143. This ensures that, the ink ejecting path 20b is formed that is consisted of the first ink ejecting path 20b1, the second ink ejecting path 20b2, and the third ink ejecting path 20b3. The ink ejecting path 20b is a straight hole whose transverse sectional area is approximately constant in the length direction. The opening of the ink ejecting path 20b is the ink ejecting port 20c.

The diameter D2 of the third ink ejecting path (third through hole) 20b3 is approximately equal to the diameter D1 of the second ink ejecting path (second through hole) 20b2. Thus, the inner circumference surface of the second ink ejecting path (second through hole) 20b2 and the inner circumference surface of the third ink ejecting path (third through hole) 20b3 are approximately flush.

Thus, the nozzle hole 20 consisted of the recessed part 20a and the ink ejecting path 20b is formed on the stack film consisted of the nozzle wafer 140, the silicon oxide film 142, and the water repellent film 143. The stack film consisted of the nozzle wafer 140, the silicon oxide film 142, and the water repellent film 143 configures the nozzle substrate aggregation 150. Thus, the nozzle substrate aggregation 150 with the support wafer 146 is obtained that is consisted of the nozzle substrate aggregation 150 and the support wafer 146 pasted on the nozzle substrate aggregation 150 through the protection tape 144 and the heat separation tape 145.

The nozzle substrate aggregation 150 with the support wafer 146 obtained as described above is pasted on the rear surface 100b of the actuator wafer 100 of the substrate assembly aggregation 110. Then, the protection tape 144, the heat separation tape 145, and the support wafer 146 are separated from the nozzle substrate aggregation 150.

Figure 17A:
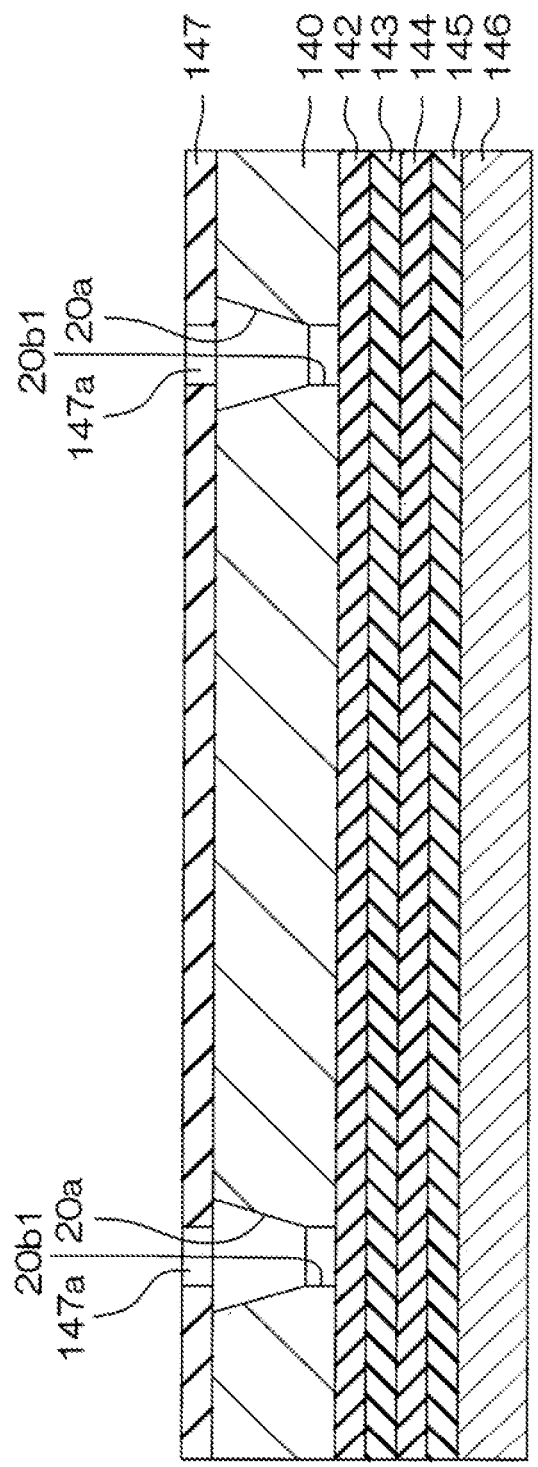
FIG. 17A is a transverse sectional view illustrating a comparative example of the production step of the nozzle substrate aggregation, and is a transverse sectional view illustrating the next step of FIG. 14D.
Figure 17B:
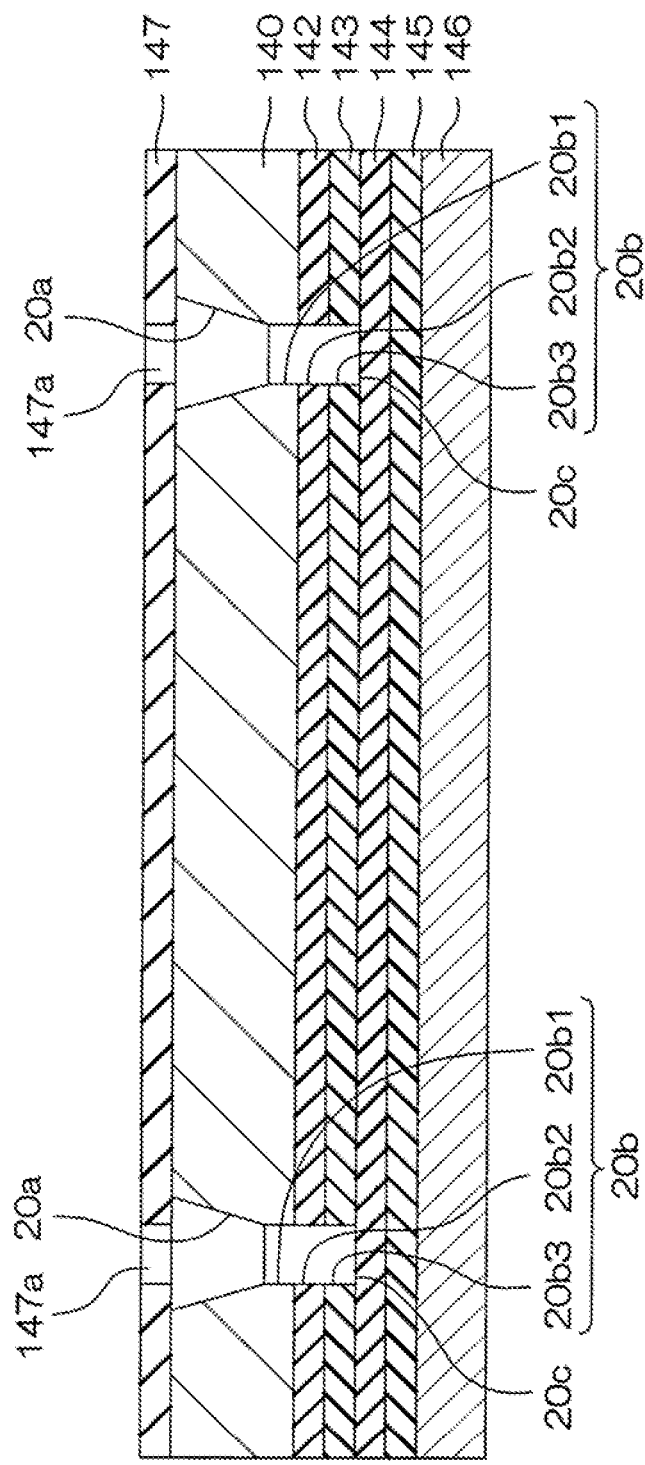
FIG. 17B is a transverse sectional view illustrating a next step of FIG. 17A.
Figure 17C:
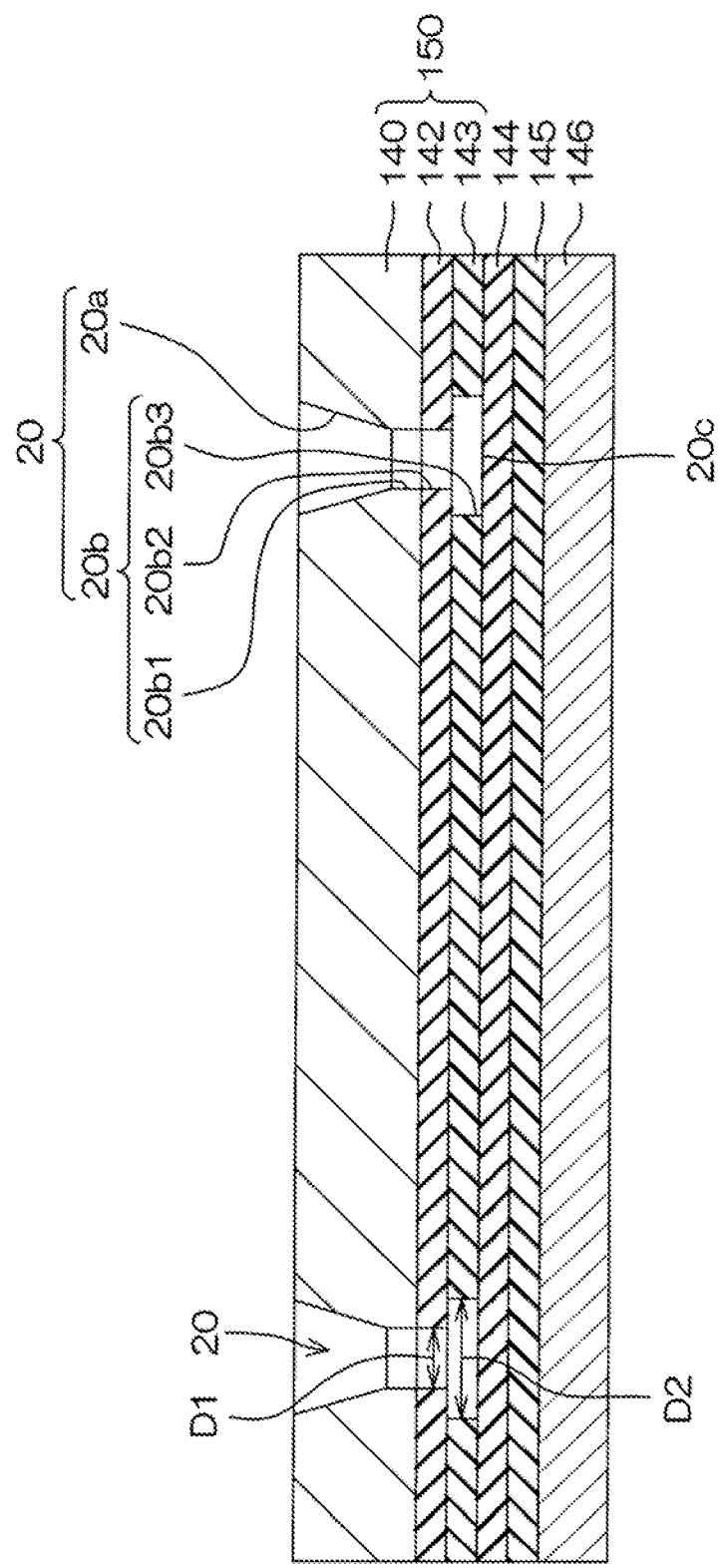
FIG. 17C is a transverse sectional view illustrating a next step of FIG. 17B.

FIGS. 17A, 17B and 17C are transverse sectional views illustrating comparative examples of the production method of the nozzle substrate aggregation 150. FIGS. 17A, 17B and 17C are transverse sectional views illustrating a next step of FIG. 16D as described above.

Even as for comparative examples, the steps from FIGS. 16A, 16B, 16C and 16D described above are the same. When the nozzle wafer 140 is subjected to film thinning by the step of FIG. 16D, the resist mask 147 including an opening 147a corresponding to the nozzle hole 20 (ink ejecting path 20b) is formed by photolithography as illustrated in FIG. 17A, and the resist mask 147 is used as the mask so that the nozzle wafer 140 is subjected from the surface to dry etching. This ensures that, the recessed part 20a is formed on the surface of the nozzle wafer 140 and the first ink ejecting path 20b1 is formed on the bottom surface of the recessed part 20a. Specifically, for example, first, the anisotropic etching is gradually increased from the isotropic etching so as to form the recessed part 20a having the truncated cone shape. Then, the solid cylindrical first ink ejecting path 20b1 is formed, for example, by Bosch process. It is noted that the recessed part 20a may be formed by the isotropic etching and the first ink ejecting path 20b1 may be formed by the anisotropic etching. The recessed part 20a has a truncated cone shape whose transverse section is gradually reduced from the surface 140a side of the nozzle wafer 140 to the silicon oxide film 142 side.

Next, as illustrated in FIG. 17B, the resist mask 147 is used as the mask, and the silicon oxide film 142 and the water repellent film 143 are subjected to etching in sequence. Even in this comparative example, the etchings of the silicon oxide film 142 and the water repellent film 143 are anisotropic dry etchings. This ensures that, the second ink ejecting path 20b2 connecting to the first ink ejecting path 20b1 is formed on the silicon oxide film 142, and then the third ink ejecting path 20b3 connecting to the second ink ejecting path 20b2 is formed on the water repellent film 143. This ensures that, the ink ejecting path 20b is formed that is consisted of the first ink ejecting path 20b1, the second ink ejecting path 20b2, and the third ink ejecting path 20b3. The opening of the ink ejecting path 20b is the ink ejecting port 20c.

Next, as illustrated in FIG. 17C, ashing processing for removing the resist mask 147 is performed so that the resist mask 147 is removed. At that time, the circumference wall of the third ink ejecting path (third through hole) 20b3 of the water repellent film 143 is subjected to etching by ashing gas, and the third ink ejecting path 20b3 is enlarged. When the diameter of the second ink ejecting path (second through hole) 20b2 formed on the silicon oxide film 142 is represented by D1 and the diameter of the third ink ejecting path (third through hole) 20b3 is represented by D2, D1=17.5 µm and D2=21.5 µm was satisfied. That is, in the comparative example, the value (D2−D1) (enlargement amount of the diameter D2 of the third ink ejecting path 20b3) in which the diameter D1 of the second ink ejecting path (second through hole) 20b2 is subtracted from the diameter D2 of the third ink ejecting path (third through hole) 20b3 was 4 µm. The percentage of the ratio {(D2−D1)/D1} of the value, in which the diameter D1 is subtracted from the diameter D2, with respect to the diameter D1 was 22.9%.

In the case of the embodiment according to the present disclosure that the diameter D1 of the second ink ejecting path (second through hole) 20b2 was 17.5 µm, the diameter D2 of the third ink ejecting path (third through hole) 20b3 was approximately 17.9 to 19.5 µm. Thus, in the present embodiment, the value (D2−D1) (enlargement amount of the diameter D2 of the third ink ejecting path 20b3) in which the diameter D1 is subtracted from the diameter D2 is 0.4 to 2.0 µm, and is considered to be equal to or less than ½ of 4 µm of the comparative example. In addition, the percentage of the ratio {(D2−D1)/D1} of the value, in which the diameter D1 is subtracted from the diameter D2, with respect to the diameter D1 in the present embodiment is equal to or less than 11.5%, and is considered to be smaller than 22.9% of the comparative example. That is, in the present embodiment, with respect to the nozzle substrate 3 (140) including the water repellent film 32 (143), it is possible to form the preferable nozzle hole 20 as compared with the comparative example.

While the embodiment of the present disclosure is described above, the present disclosure may be further implemented in another embodiment. In the embodiment described above, the recessed part 20a is formed to have the truncated cone shape whose transverse section is gradually reduced from the surface of the silicon substrate 30 to the silicon oxide film 31 side. However, it may be formed to have a truncated cone shape whose transverse section is gradually increased from the surface of the silicon substrate 30 to the silicon oxide film 31 side. In addition, the recessed part 20a may be a straight hole whose the transverse section is approximately constant in the length direction.

In addition, while the recessed part 20a having the truncated cone shape and the solid cylindrical first ink ejecting path 20b1 penetrating the low wall of the recessed part 20a of the silicon substrate 30 are formed on the silicon substrate 30 of the embodiment described above, only the recessed part 20a having the truncated cone shape penetrating the silicon substrate 30 may be formed on the silicon substrate 30. That is, the first through hole penetrating the silicon substrate 30 may be consisted of only the recessed part 20a having the truncated cone shape. Even in this case, the silicon substrate 30 (nozzle wafer 140) on which the recessed part 20a is formed is used as the hard mask, and the silicon oxide film 31 (142) and the water repellent film 32 (143) are subjected to etching in sequence. This ensures that, the second through hole connected to the recessed part 20a is formed on the silicon oxide film 31 (142), and then the third through hole connected to the second through hole is formed on the water repellent film 32 (143).

In addition, while two rows of the piezoelectric element arrays (pressure chamber arrays) are disposed on the actuator substrate 2, one row of the piezoelectric element array (pressure chamber array) may be disposed or not less than 3 rows of the piezoelectric element arrays (pressure chamber arrays) may be disposed.

In addition, while the insulation film 15 is formed on the partial surface of the hydrogen barrier film 14 in the embodiment described above, the insulation film 15 may be formed on the entire region of the surface of the hydrogen barrier film 14.

In addition, while the insulation film 15 is formed on the partial surface of the hydrogen barrier film 14 in the embodiment described above, the insulation film 15 may not be disposed.

In addition, while PZT was described as the material of the piezoelectric film in the embodiment described above, a piezoelectric material may be applied that is consisted of metallic oxide represented by lead titanate (PbPO3), potassium niobate (KNbO3), lithium niobate (LiNbO3), lithium tantalate (LiTaO3), and the like.

About the other things, it is possible to accept various design change within the range of matters recited in claims.

The present disclosure contains subject matter related to that disclosed in Japanese Priority Patent Application JP 2016-215418 filed in the Japan Patent Office on Nov. 2, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A nozzle substrate, comprising:
  a main substrate including a first surface and a second surface;
  an oxidation film formed on the second surface of the main substrate; and
  a water repellent film formed on a surface of the oxidation film, wherein
    the surface of the oxidation film is at an opposite side to a main substrate side of the oxidation film,
    the nozzle substrate includes a nozzle hole that penetrates in a thickness direction of the nozzle substrate,
    the nozzle hole includes a first through hole that penetrates the main substrate in the thickness direction, a second through hole that penetrates the oxidation film and being connected to the first through hole, and a third through hole that penetrates the water repellent film and being connected to the second through hole,
    the first through hole includes a recessed part formed on the first surface of the main substrate and a hole penetrating a bottom wall of the recessed part of the main substrate,
    the recessed part has a truncated cone shape whose transverse section is gradually reduced from the first surface of the main substrate to an oxidation film side of the main substrate,
    the nozzle hole includes an ink ejecting path,
    the ink ejecting path includes the hole, the second through hole, and the third through hole,
    the ink ejecting path has a solid cylindrical shape, and
    an inner circumference surface of the second through hole and an inner circumference surface of the third through hole are approximately flush.

2. The nozzle substrate according to claim 1, wherein
each of a transverse section of the second through hole and a transverse section of the third through hole is circular, and
percentage of a ratio (D2−D1)/D1 of a value, in which a diameter D1 of the second through hole is subtracted from a diameter D2 of the third through hole, relative to the diameter D1 of the second through hole is equal to or less than 11.5%.

3. The nozzle substrate according to claim 1, wherein
the main substrate is a silicon substrate,
the oxidation film is a silicon oxide film, and
the water repellent film is made of fluorine-based polymer.

* * * * *